United States Patent [19]
Ui et al.

[11] Patent Number: 5,976,992
[45] Date of Patent: Nov. 2, 1999

[54] METHOD OF SUPPLYING EXCITED OXYGEN

[75] Inventors: Akio Ui, Tokyo; Isao Matsui, Tokorozawa; Yoshiaki Nakamura, Yokohama, all of Japan

[73] Assignee: Kabushiki Kaisha Toshiba, Kawasaki, Japan

[21] Appl. No.: 08/312,626

[22] Filed: Sep. 27, 1994

[30] Foreign Application Priority Data

Sep. 27, 1993 [JP] Japan .................................. 5-239447

[51] Int. Cl.⁶ ................................................ H01L 21/316
[52] U.S. Cl. ......................... 438/788; 427/561; 427/562; 427/579
[58] Field of Search ..................... 437/235, 238; 427/255.3, 561, 562, 579; 438/788, 778, 789

[56] References Cited

U.S. PATENT DOCUMENTS

| | | | |
|---|---|---|---|
| 4,615,298 | 10/1986 | Yamazaki | 118/725 |
| 5,178,905 | 1/1993 | Kanai et al. | 427/570 |
| 5,246,886 | 9/1993 | Sakai et al. | 437/228 |
| 5,374,613 | 12/1994 | Noda et al. | 505/477 |
| 5,403,630 | 4/1995 | Matsui et al. | 427/583 |
| 5,522,343 | 6/1996 | Kodama et al. | 118/723 MP |
| 5,645,897 | 7/1997 | Andra | 427/526 |

FOREIGN PATENT DOCUMENTS 2-39421  2/1990  Japan .

OTHER PUBLICATIONS

Lee, Hong H., Fundamentals, of Microelectronics Processing, p. 424, 1990.

Jpn. J. Appl. Phys., vol. 33, 1994, pp. 3520–3527, Part 1, No. 6A, Jun. 1994, Sunil Wickramanayaka, et al., "Remote Plasma SiO2, Deposition by Tetraethoxysilane with Chemically and Energetically Different Atomic Species".

*Primary Examiner*—Charles Bowers
*Assistant Examiner*—Matthew Whipple
*Attorney, Agent, or Firm*—Oblon, Spivak, McClelland, Maier & Neustadt, P.C.

[57] ABSTRACT

A method of supplying an excited oxygen, which comprises the steps of exciting a oxygen gas or a gas containing an oxygen atoms with plasma in a plasma discharge zone thereby forming an excited oxygen, and transferring a gas containing the excited oxygen into a reaction zone disposed next to the plasma discharge zone while keeping a pressure within the plasma discharge zone lower than that of the reaction zone. In a reaction chamber, a reaction by the excited oxygen is effected. As a result, the formation of a thin film on a substrate disposed in a reaction chamber, the etching of the substrate and the cleaning of the interior of the reaction chamber can be carried out.

11 Claims, 17 Drawing Sheets

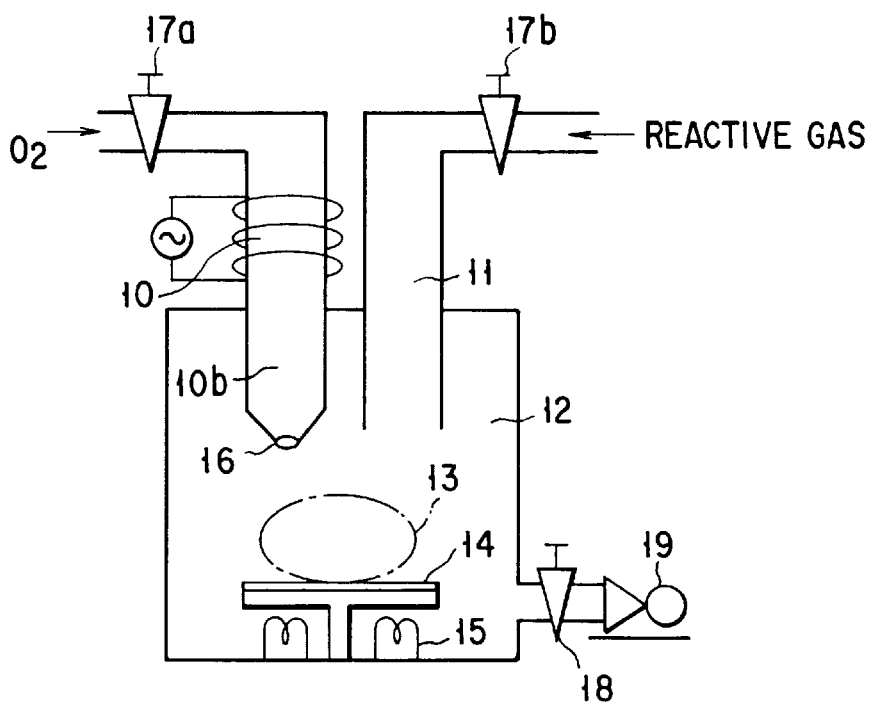
F I G. 2

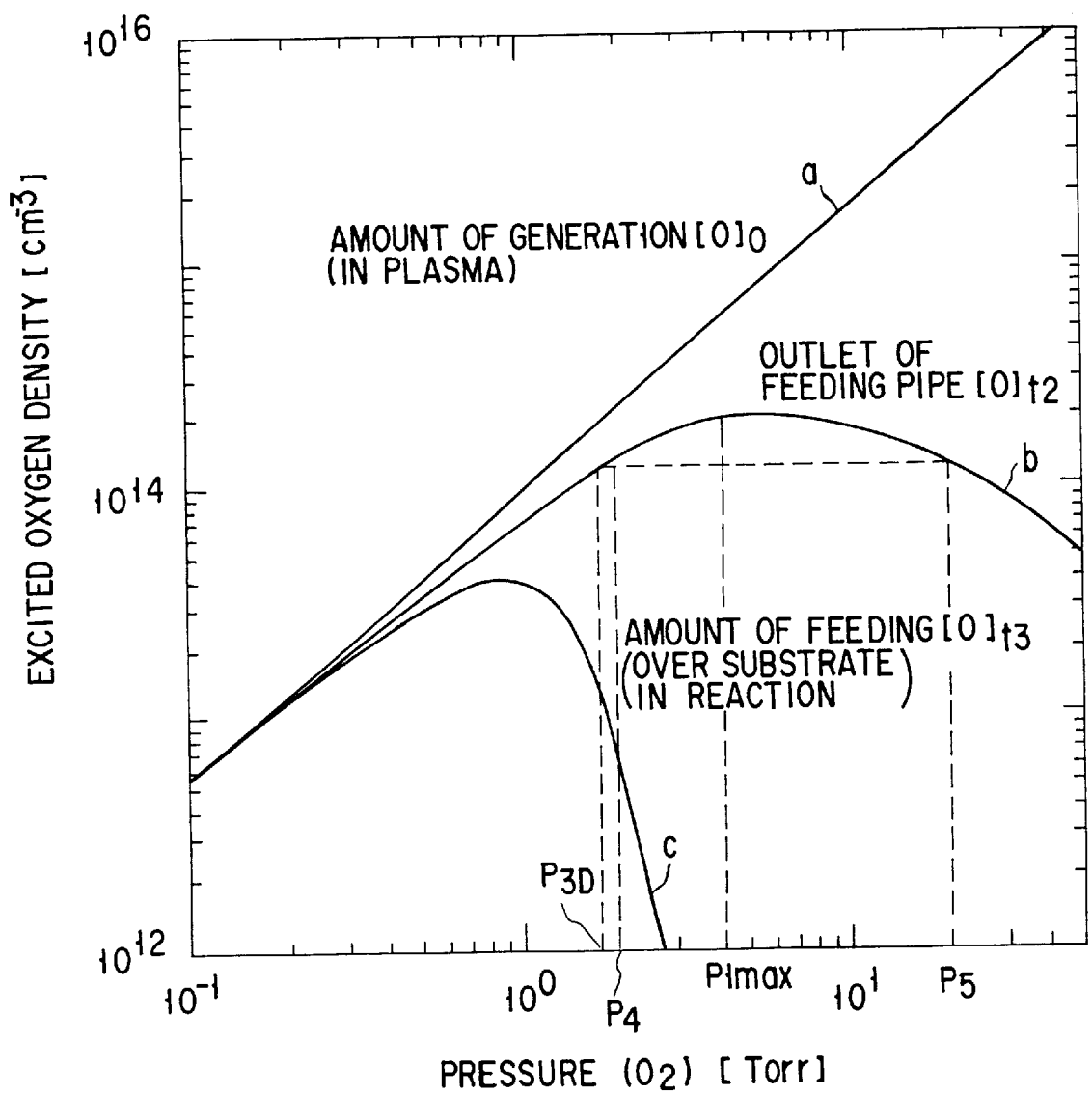
F I G. 3

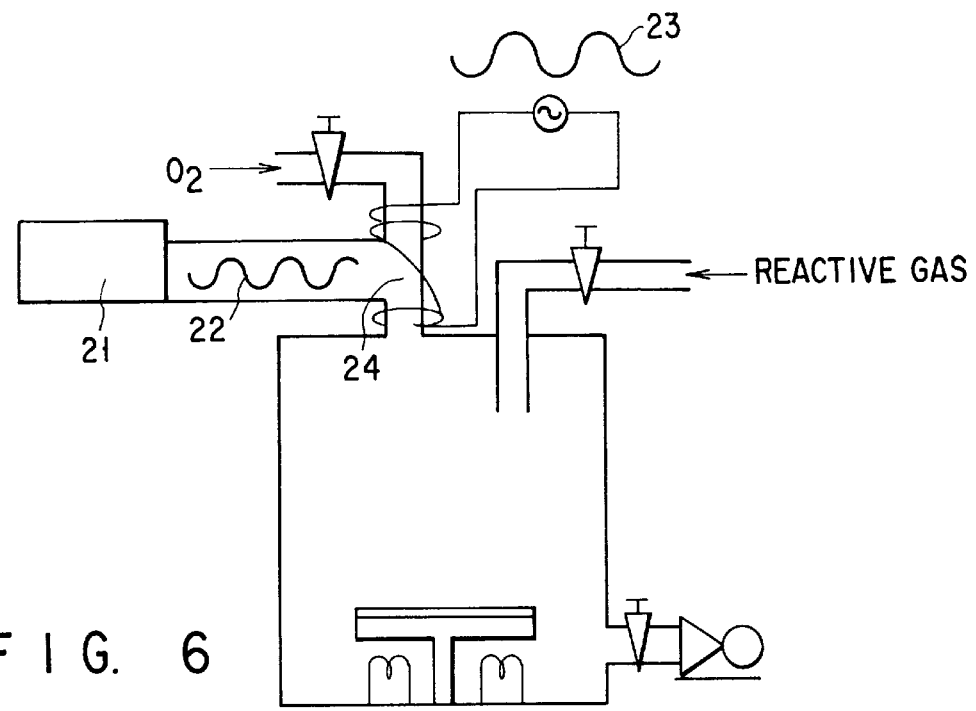
F I G. 6
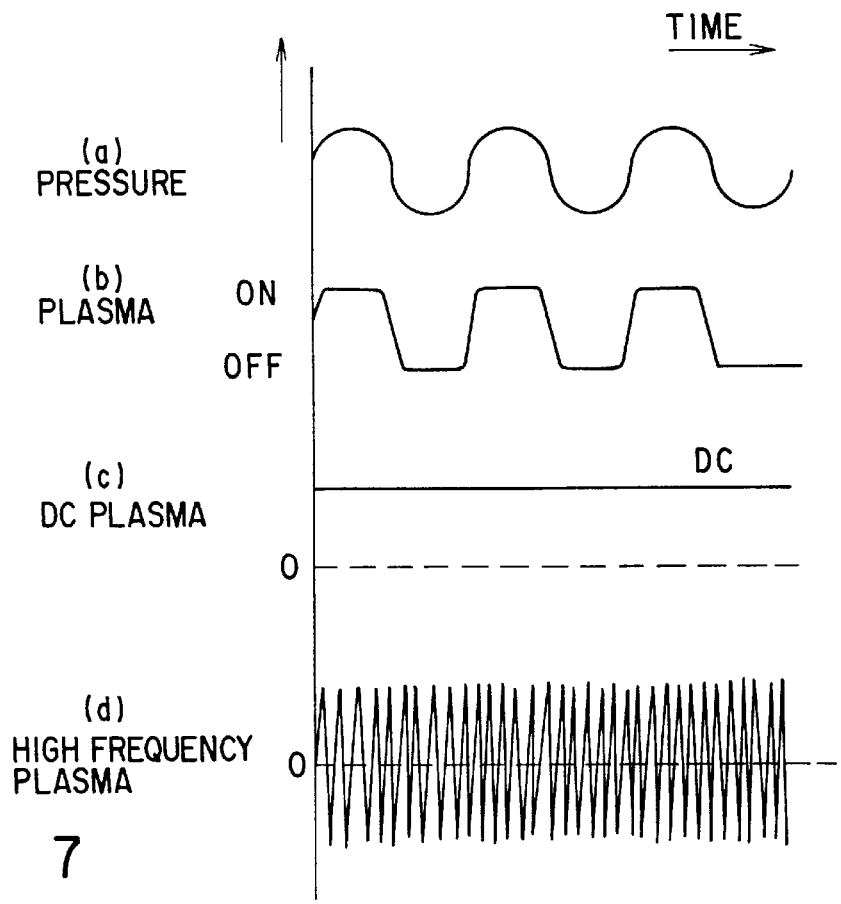
F I G. 7

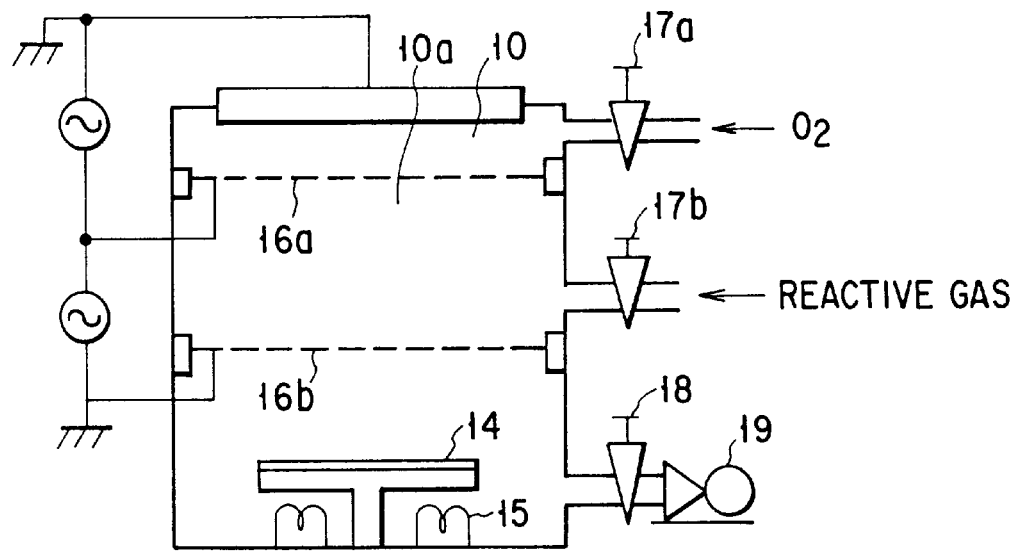
F I G. 8
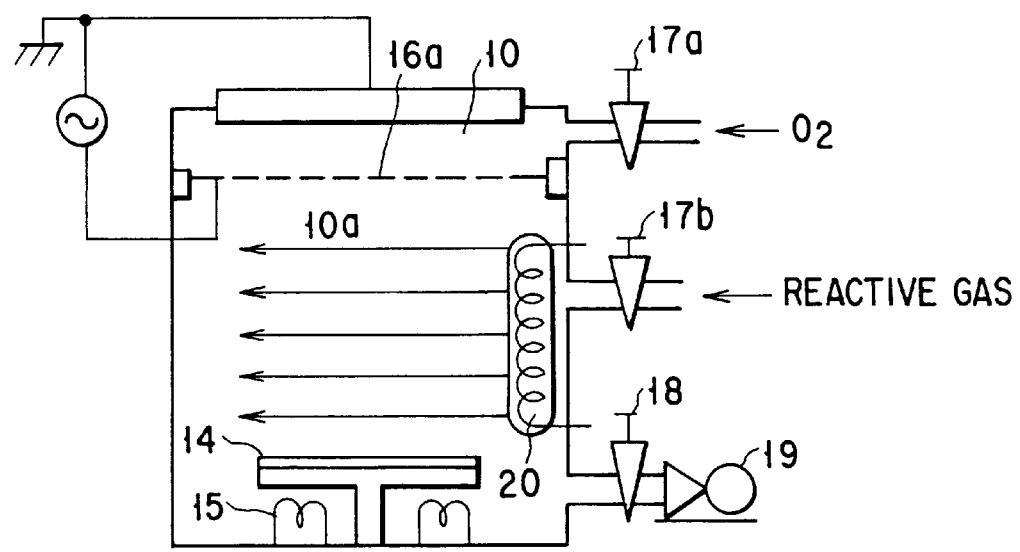
F I G. 9

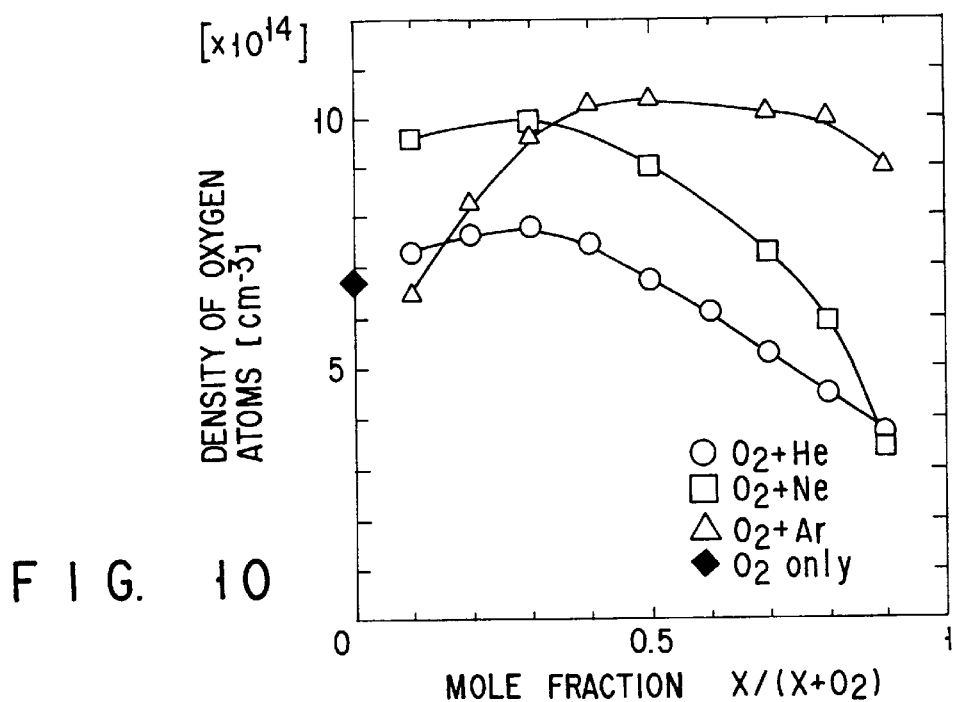
F I G. 10
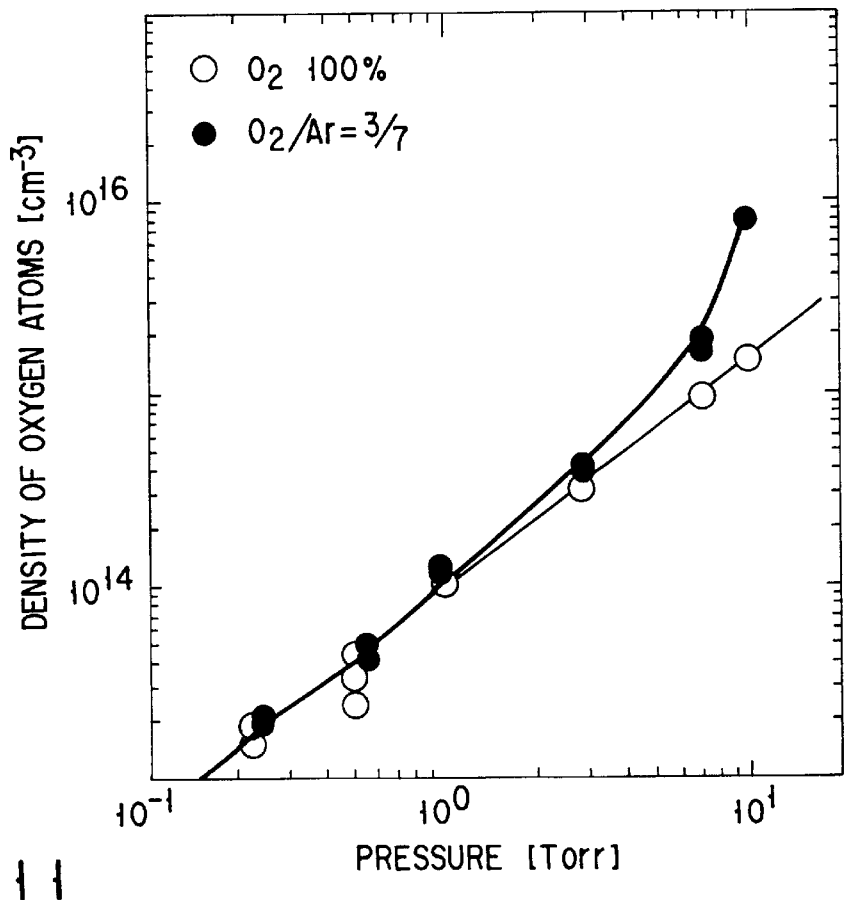
F I G. 11

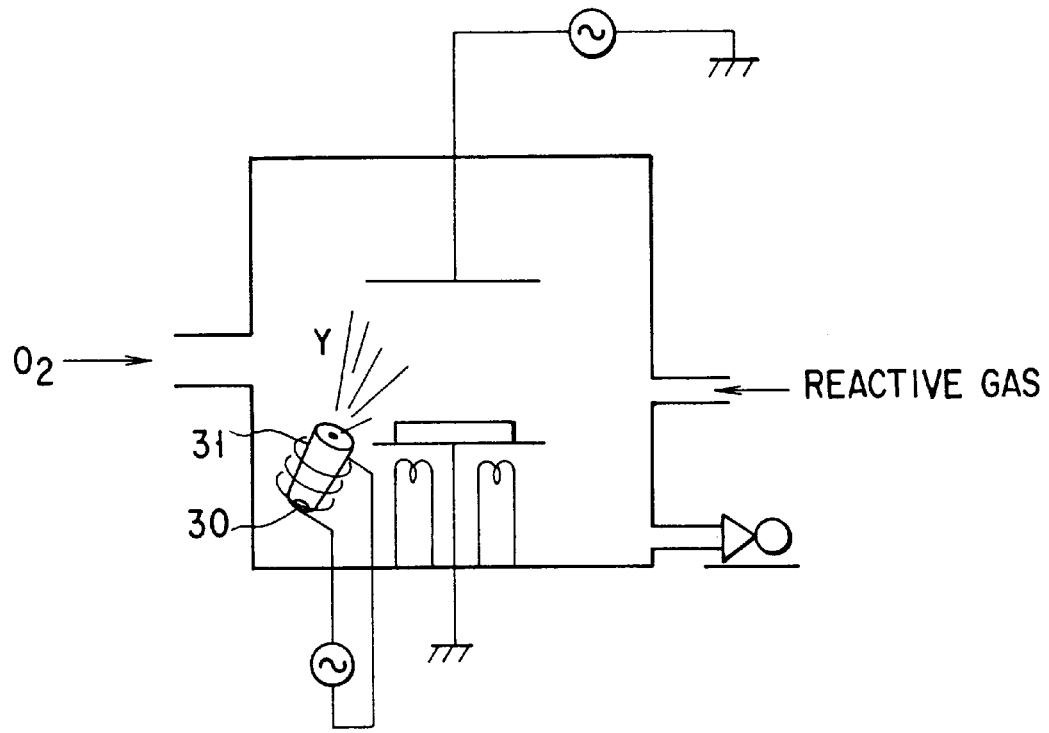
F I G. 13
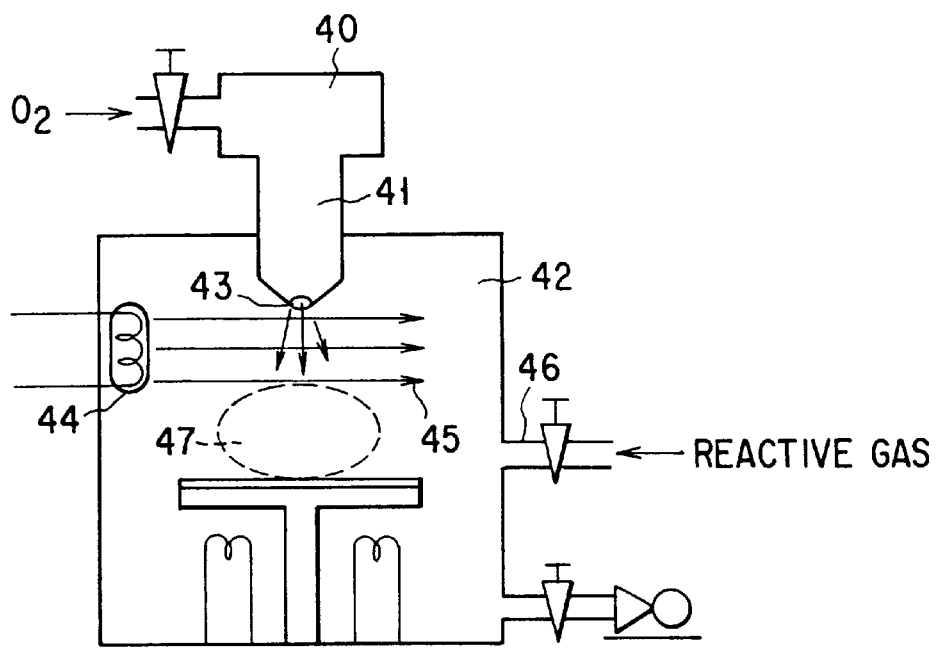
F I G. 14

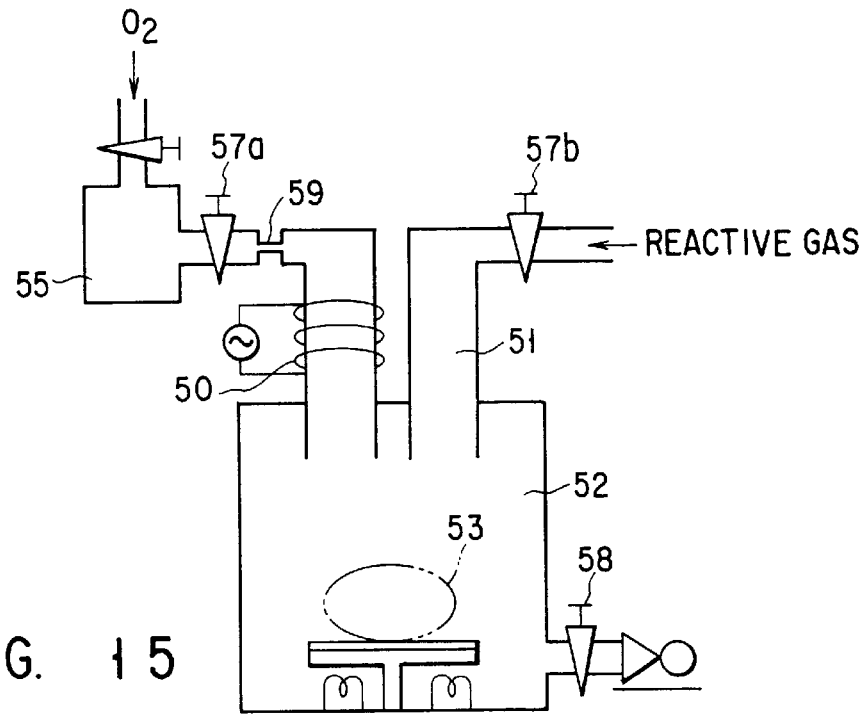
F I G. 15
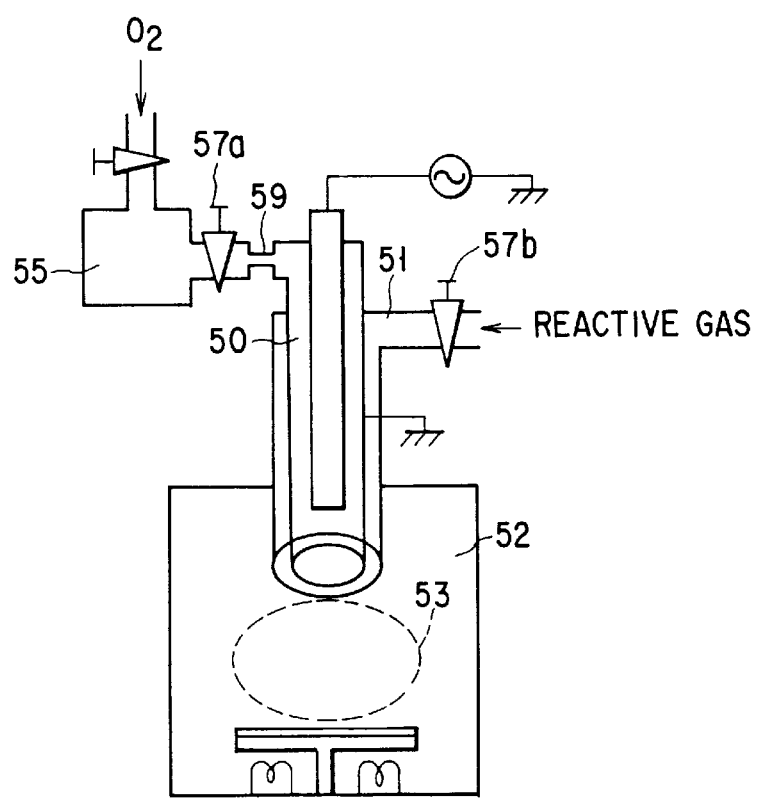
F I G. 16

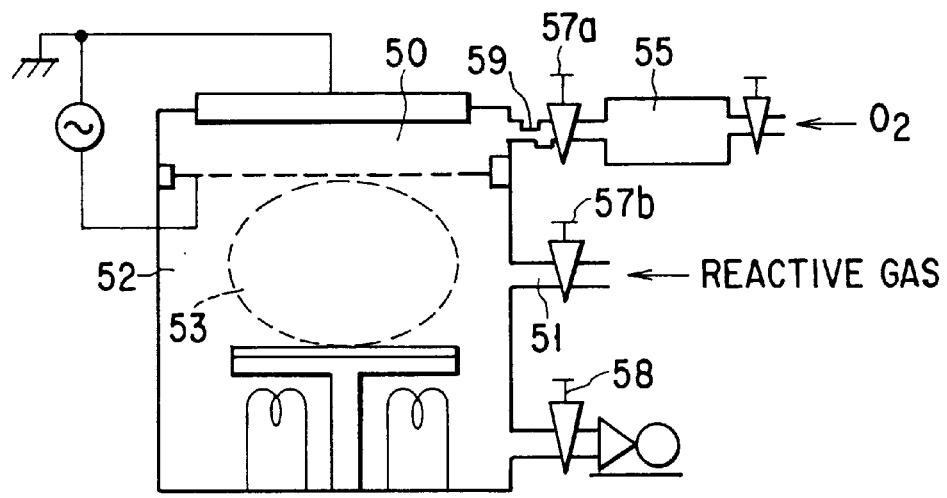
F I G. 17
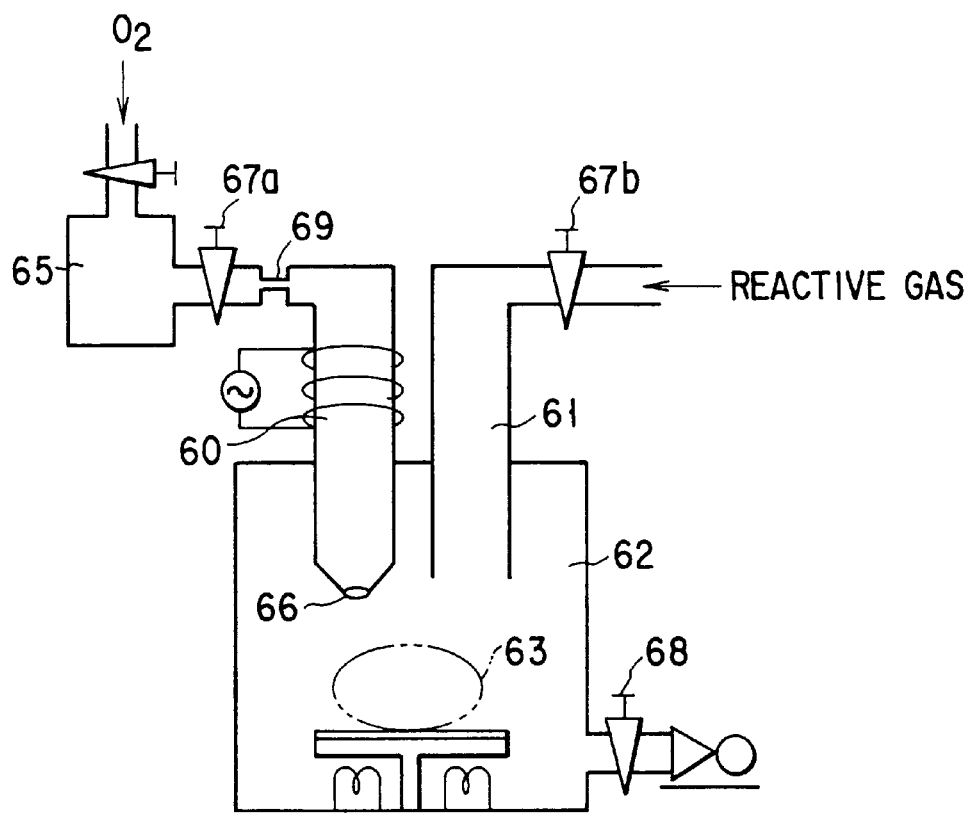
F I G. 18

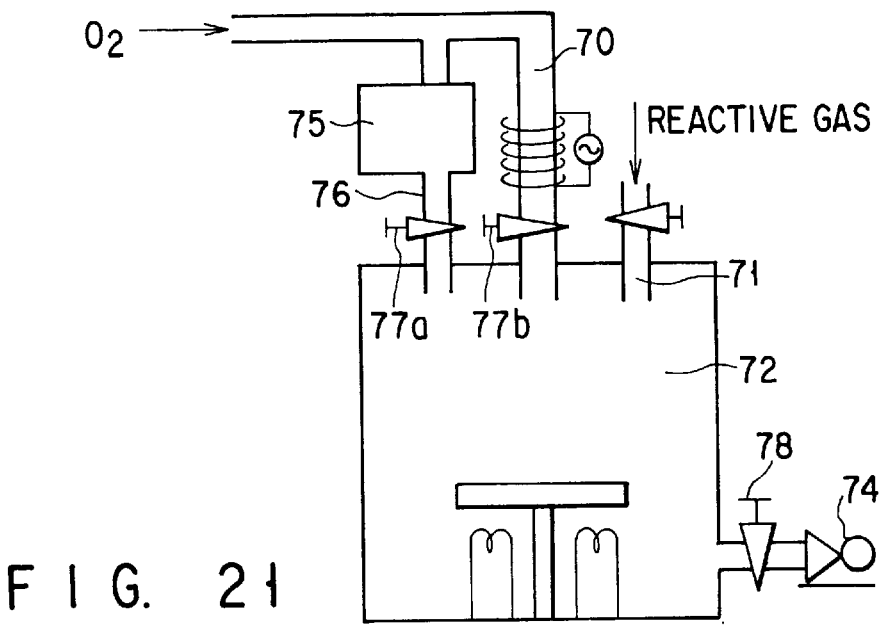
F I G. 21
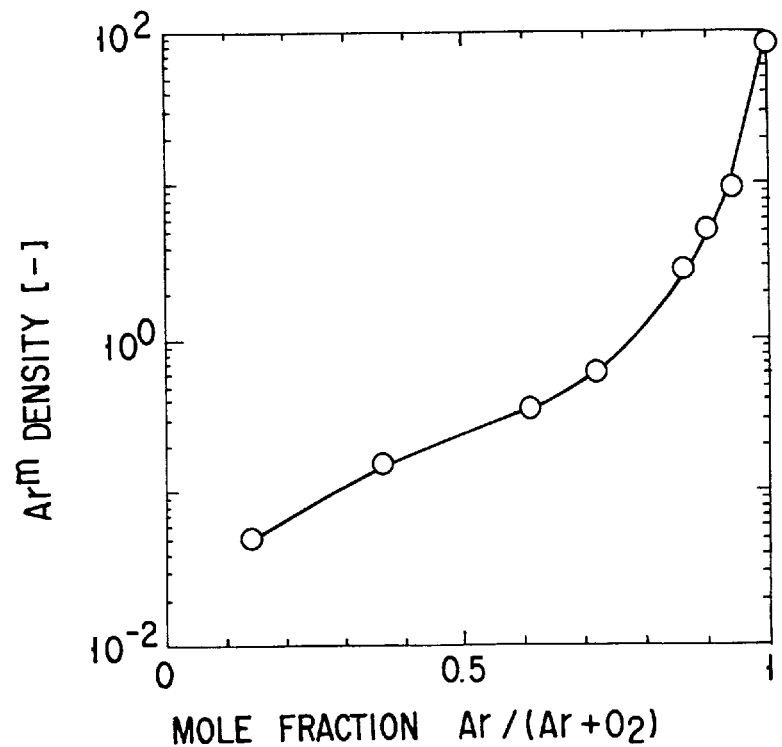
F I G. 22

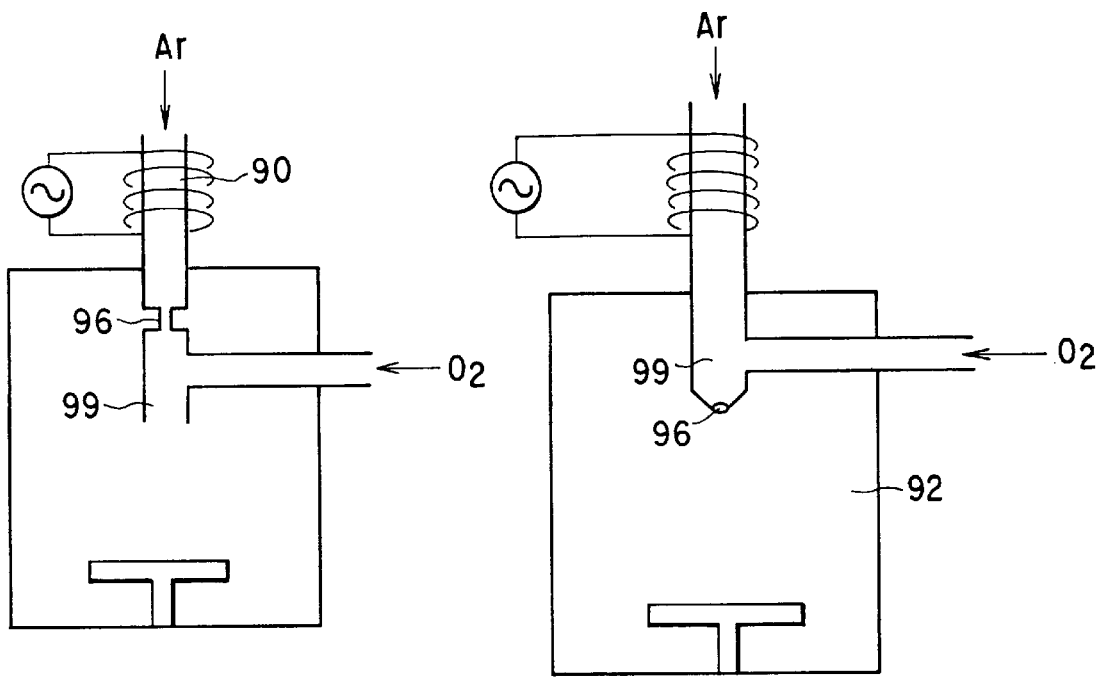
F I G. 26    F I G. 27
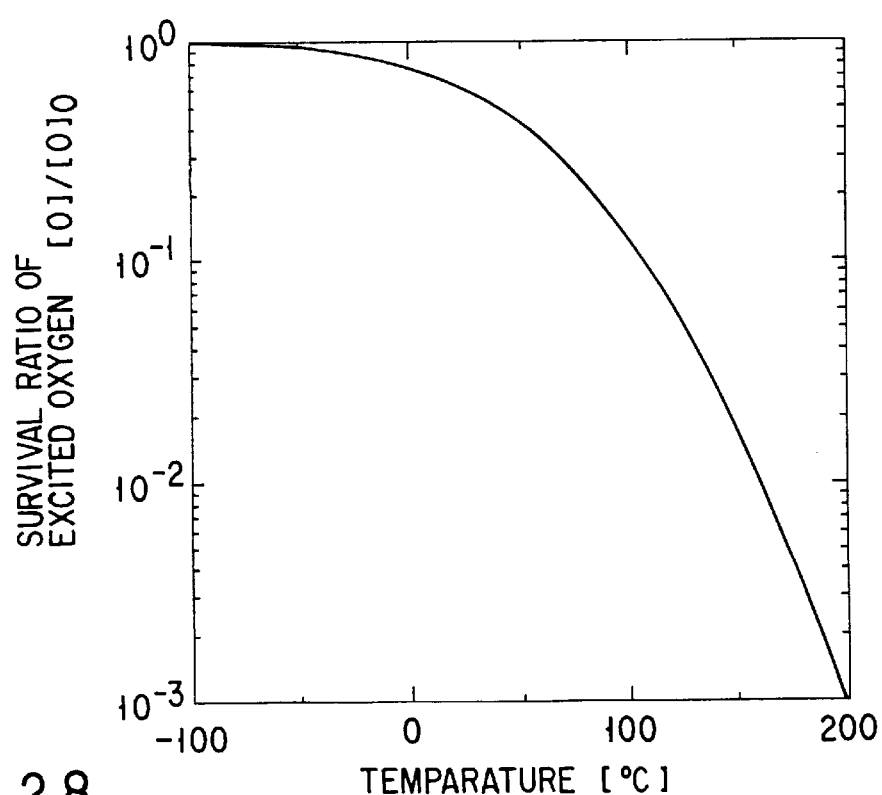
F I G. 28

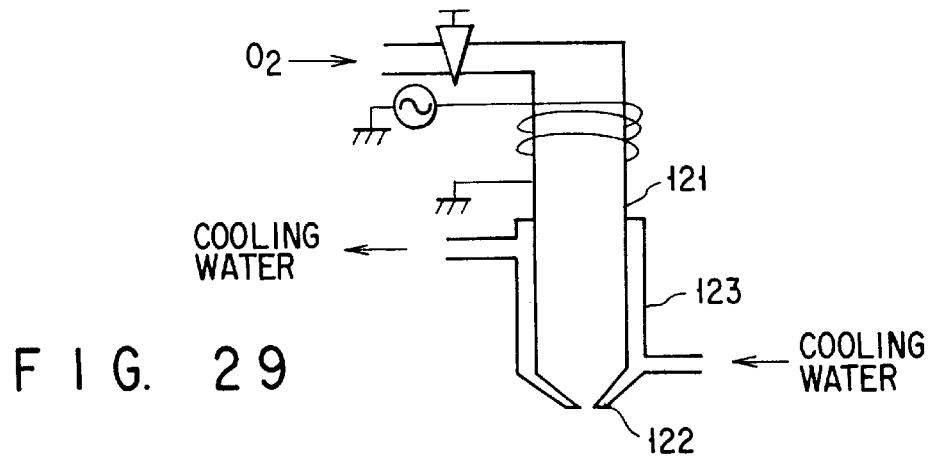
F I G. 29
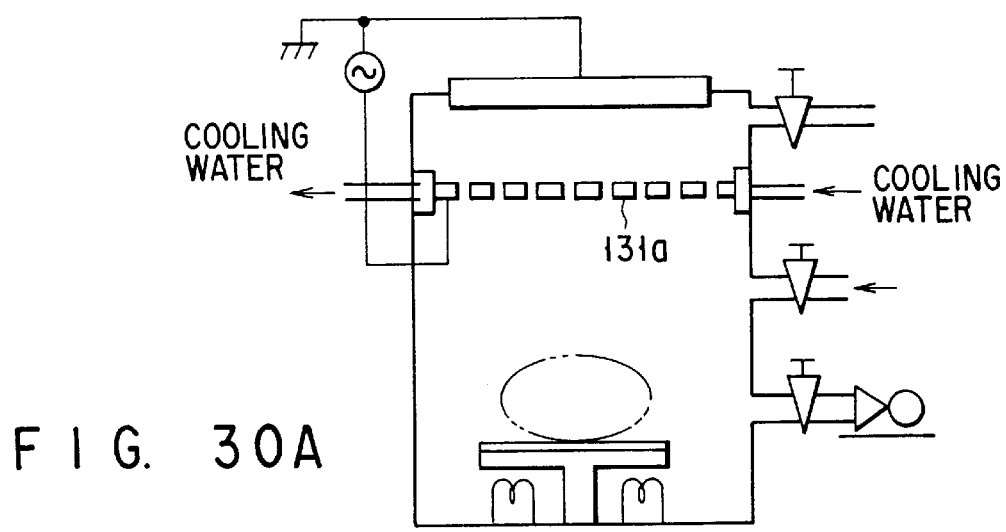
F I G. 30A
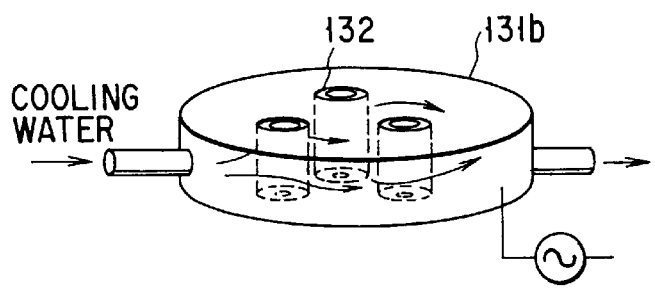
F I G. 30B
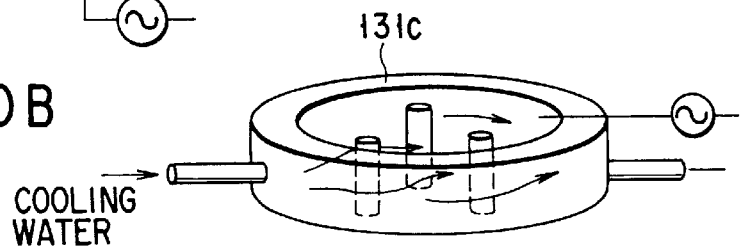
F I G. 30C

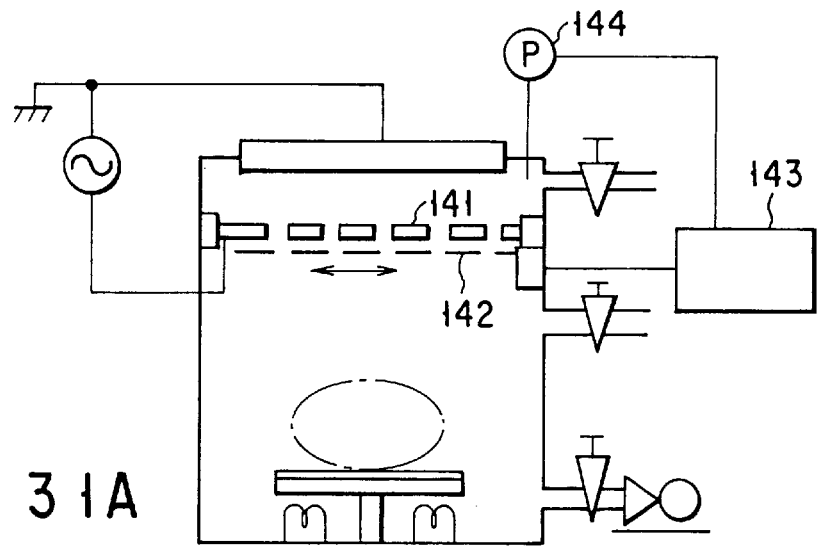
F I G. 3 1 A
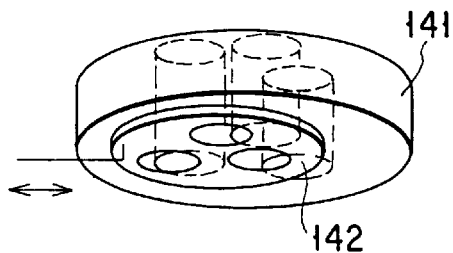
F I G. 3 1 B
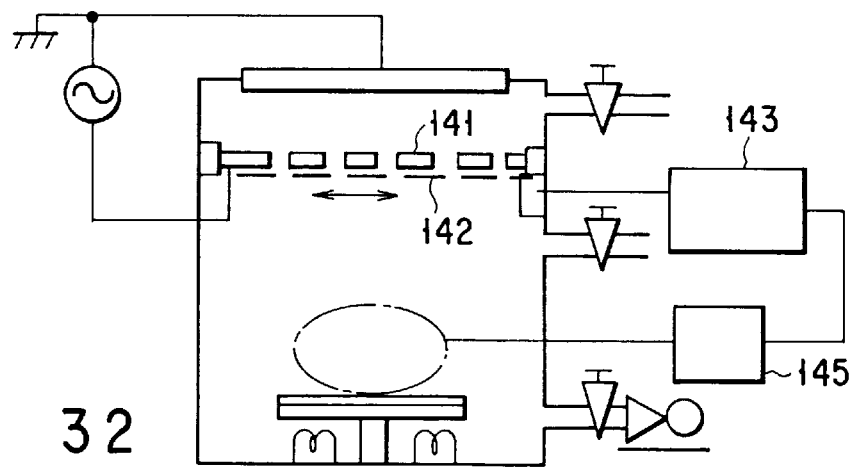
F I G. 3 2

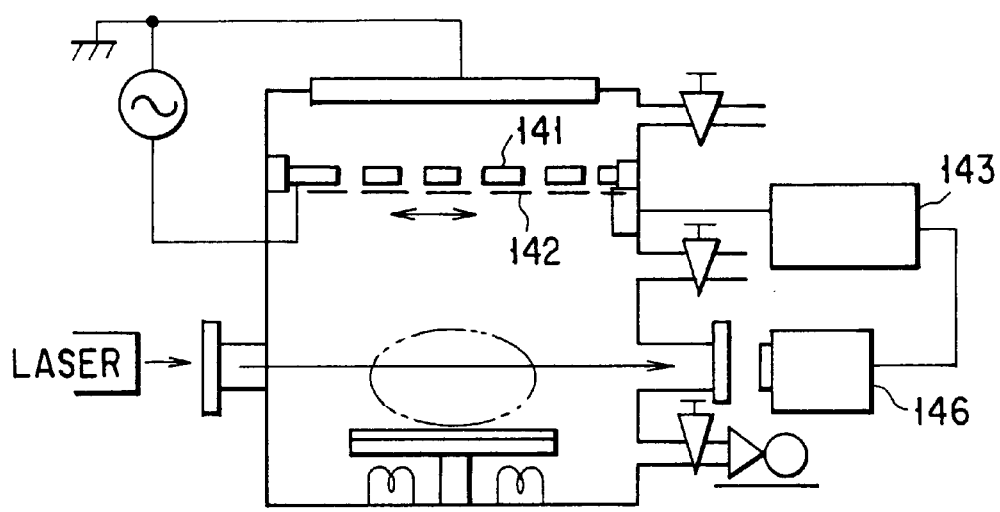
F I G. 33
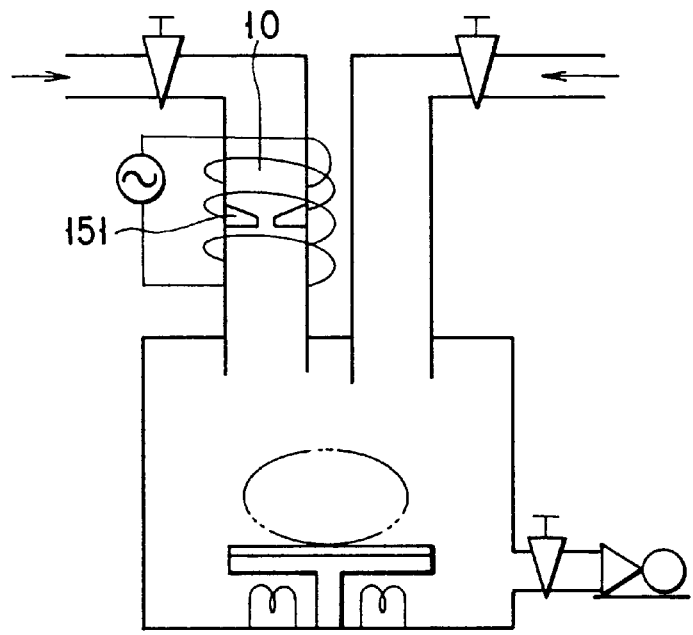
F I G. 34

METHOD OF SUPPLYING EXCITED OXYGEN

BACKGROUND OF THE INVENTION

1. Field of the Invention

This invention relates to a method of supplying an excited oxygen to be used in the steps of manufacturing a semiconductor device such as a very large scale integrated (VLSI) device, for example in the step of forming a thin film, etching a substrate, removing a resist, cleaning a chamber, or improving the characteristics of a thin film.

2. Description of the Related Art

An excited oxygen is useful in the steps of manufacturing a semiconductor device such as a very large scale integrated (VLSI) device, for example in the step of forming a thin film, etching a substrate, removing a resist, cleaning a chamber, or improving the characteristics of a thin film.

Out of these utilities of the excited oxygen, one example of the conventional technique of forming a silicon oxide film by means of a remote plasma CVD, which is one of the methods of forming a thin film, will be explained below.

Since the latest VLSI device is provided with a groove of high aspect ratio (depth/width), it is increasingly demanded to deposit an insulating film having an excellent step coverage in such a groove at a low temperature. As one of the methods meeting such a demand, there is known a method which makes use of the reaction between TEOS (tetraethoxysilane) and ozone. However, since the reactivity of ozone is insufficient, the film deposited by this method is poor in insulation properties, thus badly affecting the life of a VLSI device to be finally obtained. Meanwhile, a method of forming a film excellent in density and insulation properties at a low temperature by making use of a reaction between a highly reactive excited oxygen and TEOS (for example, Matsui et al, Annual Spring Meeting of Appl. Phys. Inst., 28a-SZG-8(1992)) has been proposed.

FIG. 1 illustrates a schematic view of one example of the conventional film-forming device to be employed. According to this film-forming device, an excited oxygen (mainly in the form of oxygen atom) generated at a plasma discharge zone 100 and a reaction gas of TEOS supplied from a reaction gas-supplying pipe 101 are mixed in a reaction chamber 102 located away from the plasma discharge zone 100 and reacted at a reaction zone 103, thereby forming at a low temperature (about 250 to 350° C.) an oxide film on a substrate 105 heated with a heater 104. A residual gas is discharged through an exhauster 109.

An excited oxygen to be generated by plasma (such as an oxygen atom, an oxygen atom in an excited state, an oxygen molecule in an excited state) is highly reactive, so that it is effective in forming a film at a low temperature, but is short in life so that it is very difficult to produce a large quantity of the excited oxygen by means of ordinary plasma exciting method, or to transport a large quantity of the excited oxygen from a generation zone to a reaction zone. It is possible to increase the generation of excited oxygen by increasing the power of plasma. However, it will give rise to problems of the change of discharge-mode to another, or of instability of the discharge. Therefore, any attempt to increase the amount of excited oxygen by increasing the power of plasma is naturally limited.

As explained above, since the density of excited oxygen to be attained by the conventional oxygen-exciting method is low, the application of this conventional oxygen-exciting method to the formation of a film through a CVD method is inevitably resulted in a low film-growth rate. The same thing can be said if the conventional oxygen-exciting method is applied to the method of etching a substrate, removing a resist, cleaning a chamber, or improving the characteristics of a thin film. Namely, since it is impossible according to the conventional oxygen-exciting method to increase the density of excited oxygen, it can not be expected to improve the processing rate of these treatments.

As explained above, the conventional method of generating and supplying excited oxygen is accompanied with problems that it is difficult to produce a large quantity of excited oxygen and to transport a large quantity of excited oxygen from a generation zone to a reaction zone, and that only a low reaction rate would be obtainable, if the conventional method is applied to the method of forming a film, etching, removing a resist, cleaning a chamber, or improving the characteristics of a thin film.

SUMMARY OF THE INVENTION

The object of the present invention is to provide a method which is capable of generating a large quantity of excited oxygen, and supplying the large quantity of excited oxygen to a reaction zone.

Further object of the present invention is to provide an excited oxygen-supplying method which is capable of generating a large quantity of excited oxygen.

According to this invention, there is provided a method of supplying an excited oxygen, which comprises the steps of exciting a gas containing an oxygen gas or oxygen atoms with plasma in a first atmosphere thereby forming an excited oxygen, and transferring a gas containing the excited oxygen into a second atmosphere disposed next to the first atmosphere while keeping a pressure within the second atmosphere lower than that of the first atmosphere.

This invention further provides a method of generating excited oxygen comprising a step of decomposing ozone with plasma.

This invention further provides a method of supplying an excited oxygen, which comprises the steps of exciting ozone with plasma in a first atmosphere thereby forming an excited oxygen, and transferring a gas containing the excited oxygen into a second atmosphere disposed next to the first atmosphere while keeping a pressure within the second atmosphere lower than that of the first atmosphere.

This invention further provides a method of generating excited oxygen comprising a step of exciting a rare gas, and introducing oxygen gas or a gas containing oxygen atom into the excited rare gas thereby generating an excited oxygen.

This invention further provides a method of supplying an excited oxygen, which comprises the steps of exciting rare gas with plasma in a first atmosphere, and introducing oxygen gas or a gas containing oxygen gas into the excited rare gas thereby generating an excited oxygen in a second atmosphere disposed next to the first atmosphere while keeping a pressure within the second atmosphere lower than that of the first atmosphere.

This invention further provides a method of supplying an excited oxygen, which comprises the steps of exciting a gas with plasma in a first atmosphere thereby forming an excited gas, and transferring the excited gas into a second atmosphere disposed next to the first atmosphere while keeping a pressure within the second atmosphere lower than that of the first atmosphere.

This invention further provides an excited gas-supplying apparatus, which comprises a plasma discharge zone, means for introducing oxygen gas or oxygen atoms into the plasma discharge zone, a reaction chamber, a reaction chamber for performing a reaction by using an excited oxygen to be generated at the plasma discharge zone, and means for controlling a pressure within the reaction chamber to become lower than that of the plasma discharge zone.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a side view of a film-forming apparatus which is furnished with an inductive coupling plasma-generating apparatus according to a first embodiment of this invention;

FIG. 3 is a graph showing a pressure dependency of the density of oxygen atoms;

FIG. 6 is a side view of a film-forming apparatus which is furnished with a pressure wave-generating apparatus according to a second embodiment of this invention;

FIG. 7 is a graph showing the changes with time of a pressure and plasma discharge;

FIG. 8 is a side view of a film-forming apparatus which is furnished with an exciting apparatus also in a reaction chamber according to a third embodiment of this invention;

FIG. 9 is a side view of a film-forming apparatus which is furnished with a light-irradiating apparatus according to a third embodiment of this invention;

FIG. 10 is a graph showing the changes in density of oxygen atoms when a rare gas is introduced into an oxygen plasma;

FIG. 11 is a graph showing a pressure dependency of the generation of oxygen atoms;

FIG. 13 is a side view of a film-forming apparatus for introducing a metallic vapor in a plasma according to a fifth embodiment of this invention;

FIGS. 14 to 21 respectively shows a side view of a film-forming apparatus which is furnished with an ozone generating apparatus according to a seventh embodiment of this invention;

FIG. 22 is a graph showing a Ar mole fraction dependency of the metastable excited argon $Ar^m$;

FIGS. 23 to 27 respectively shows a side view of a film-forming apparatus in which excited oxygen is produced by using excited argon;

FIG. 28 is a graph showing a temperature dependency of the survival rate of excited oxygen;

FIGS. 29 to 30A respectively shows a side view of a film-forming apparatus having a cooling mechanism according to a ninth embodiment of this invention;

FIGS. 30B and 30C respectively shows a perspective view of a porous plate electrode;

FIG. 31A shows a side view of a film-forming apparatus provided with a throttle whose opening area is made adjustable according to a tenth embodiment of this invention;

FIG. 31B shows a perspective view of a throttle whose opening area is made adjustable;

FIGS. 32 and 33 respectively shows a side view of another film-forming apparatus provided with a throttle whose opening area is made adjustable according to a tenth embodiment of this invention;

FIG. 34 is a side view of a film-forming apparatus provided with a pressure barrier wall in its plasma zone.

DETAILED DESCRIPTION OF THE PREFERRED EMBODIMENTS

Figure 1:
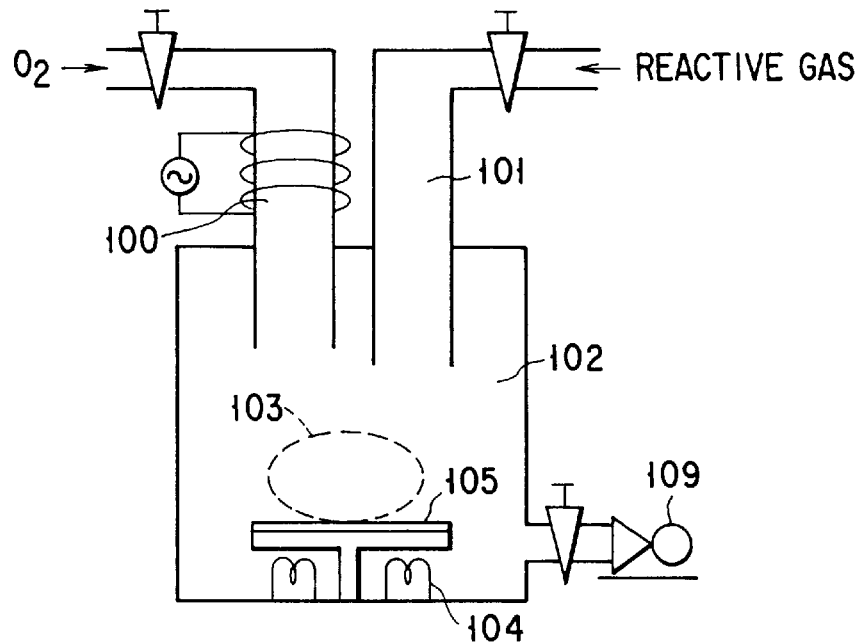
FIG. 1 is a side view of a conventional film-forming apparatus which employs an excited oxygen.

This invention will be further explained with reference to the drawings depicting various preferred embodiments. In the following explanation, an oxygen atom is selected as an example of excited oxygen, since the oxygen atom is highly reactive, and very important one among various kinds of excited oxygen. Further, the following explanation is centered on a film-forming apparatus for the convenience of understanding the present invention. It should be noted however that the present invention is also applicable to an apparatus for etching a substrate, removing a resist, cleaning a chamber, or improving features of a thin film.

FIG. 2 illustrates a schematic view of one embodiment of a film-forming apparatus to be used for carrying out the method of this invention. According to this film-forming device, an excited oxygen (mainly in the form of oxygen atom) generated at a plasma discharge zone 10 and supplied through an excited oxygen-feeding pipe 10b is mixed with a reaction gas of TEOS supplied from a reaction gas-feeding pipe 11 in a reaction chamber 12 located away from the plasma discharge zone 10, and reacted at a reaction zone 13, thereby forming at a low temperature (about 250 to 350° C.) an oxide film on a substrate 14 heated with a heater 15. A residual gas is discharged through a valve 18 by means of an exhauster 19. The reference numerals 17a and 17b respectively denotes a valve mounted on the excited oxygen-feeding pipe 10a and a valve on the reaction gas-feeding pipe 11.

The film-forming apparatus shown in FIG. 2 differs from the conventional film-forming apparatus shown in FIG. 1 in that the former apparatus is provided with a throttle 16 at the outlet port of the excited oxygen-feeding pipe 10b.

In the following paragraphs, the reaction mechanism of the generation as well as the annihilation of an excited oxygen in the film-forming apparatus shown in FIG. 2 will be explained.

Oxygen gas or a gas containing oxygen is forced to collide with electrons in the plasma discharge zone 10, thereby being excited and decomposed as shown in the following reaction formula (1).

$$O_2 + e \rightarrow O + O + e \qquad (1)$$

The oxygen atoms thus generated are then collided with each other or with oxygen molecules thereby forming oxygen molecules or ozone, thus annihilating themselves as shown in the following reaction formula (2), (3) and (4).

$$O+O_2+O_2(M) \rightarrow O_3+O_2(M) \quad (2)$$

(wherein M denotes a third body in three body collision reactions)

$$O+O+O_2(M) \rightarrow O_2+O_2(M) \quad (3)$$

$$O+O+O(M)O_2+O(M) \quad (4)$$

(wherein M denotes a third body as defined above)

Further, the excited oxygen is annihilated through surface reactions at the inner wall of the apparatus (the excited oxygen-feeding pipe 10b, throttle 6 and the reaction chamber 12) as shown in the following reaction formula (5), or through reactions with ozone as shown in the following reaction formula (6).

$$O+\text{the inner wall} \rightarrow 1/2 O_2 \quad (5)$$

$$O+O_3 \rightarrow 2O_2 \quad (6)$$

As indicated above, excited oxygen O is generated in plasma through the reaction as shown in the chemical formula (1), and is subsequently partially annihilated in the course of being supplied to the vicinity of a substrate through reactions shown in the chemical formula (2) to (6).

According to the experiments conducted by the present inventors, the density ($[O]_0$) of excited oxygen generated in a plasma under a frequency of 13.56 MHz and a power of 40 W can be represented by the following formula (7).

$$[O]0 \simeq 9.64 \times 10^{13} \times P_1 \quad (7)$$
$$\simeq 2.72 \times 10^{-3} \times [O2]$$

wherein $P_1$ denotes the pressure (Torr) in the plasma zone (=partial pressure of $O_2$), and $[O_2]$ represents the density ($cm^{-3}$) of $O_2$.

It can be seen from the formula (7) that the excited oxygen-generating reaction shown in the formula (1) can be proceeded faster as the pressure becomes higher, and the amount of excited oxygen to be generated can be increased with the increase in pressure. Meanwhile, if the pressure is higher, the annihilation reactions shown in the chemical formula (2) to (6) will be proceeded faster.

In view of these facts, it may be advisable, for the purpose of supplying a high density of excited oxygen as aimed at by this invention, to make higher the pressure in the plasma zone, and at the same time to make lower the pressure in the zone between the plasma zone and the vicinity of the substrate, which is located downstream of the plasma zone. In order to realize this arrangement, a means for adjusting (lowering) the pressure, such as throttle may be mounted on anywhere (for example an outlet port of a feeding pipe) between the plasma zone and the vicinity of the substrate, thereby increasing the generation of excited oxygen, decreasing the annihilation of excited oxygen, and thus making it possible to supply a high density of excited oxygen to the vicinity of the substrate.

Next, the adjustment of pressure at each zone for obtaining a high density of excited oxygen will be explained.

When a throttle is mounted downstream of the plasma zone, a dead space is formed between the plasma zone and the throttle. The density of excited oxygen at the outlet of the throttle [O] can be represented by the functions of a pressure $P_1$, a flow rate Q, the radius of pipe r, the length of pipe l, and a temperature T as shown below. However, if a flow rate Q, the radius of pipe r, the length of pipe l, and a temperature T are once set to prescribed values, the density of excited oxygen [O] can be represented by the function of only a pressure $P_1$.

If the pressure $P_1$ at the plasma zone is increased, the amount of generation of excited oxygen in the plasma zone can be increased, and at the same time the amount of annihilation of excited oxygen in the dead space and inside the throttle is also increased. Therefore, there is an optimum pressure ($P_{1max}$) for maximizing the density of excited oxygen to be fed from the throttle to the reaction chamber. This optimum pressure ($P_{1max}$) can be calculated as explained below.

If the reaction rate constants of the reactions shown in the above chemical formula are represented by $k_2$, $k_3$, $k_4$, $k_5$, $k_6$ respectively, the changes with time of the density of excited oxygen can be represented by the following formula (8).

$$d[O]/dt = -k_2[O][O_2]^2 - k_3[O]^2[O_2] - k_4[O]^3 - k_5[O] - k_6[O][O_3] \quad (8)$$

As for the actual value of each of $k_2$, $k_3$, $k_4$, $k_5$, $k_6$, see Chin.-Hao Chou et al, J. Appl. Phys. 72, 871(1992).

Since the relation between a prescribed position x and time t can be represented by x=vt (v is flow velocity), it is possible to calculate the value of [O] at a position x (flow time is x/v) by integrating the above formula (8). In this case, the density of excited oxygen $[O]_0$ at the outlet (t=0) of the plasma zone is set as the initial value.

By the way, since the flow velocity v is variable depending on the location, i.e. the interior of the dead space, the nozzle, and the interior of the reaction chamber, it can not be calculated at the same time. Namely, it is required to calculate each of them one after another, thereby making it possible to calculate the density of excited oxygen [O] at the vicinity of the substrate disposed in the reaction chamber.

Specifically, if the radius r (cm), length l (cm), flow velocity v (cm/s) and pressure P (Torr) of the dead space, the nozzle and the reaction chamber are represented respectively by $r_1$, $r_2$, $r_3$, $l_1$, $l_2$, $l_3$, $v_1$, $v_2$, $v_3$, $P_1$, $P_2$ and $P_3$, the flow velocity at each location can be represented by the following formula under the flow rate of $O_2$ being set to Q (ccm).

$$v_1 = (Q/60) \times (760/P_1)/(\pi \times r_1^2) \quad (9)$$

$$v_2 = (Q/60) \times (760/P_2)/(\pi \times r_2^2) \quad (10)$$

$$v_3 = (Q/60) \times (760/P_3)/(\pi \times r_3^2) \quad (11)$$

wherein $P_2 \cong P_1 > P_3$

When the flow time from the plasma zone to the inlet of throttle, the flow time from the inlet of throttle to the outlet of throttle and the flow time from the outlet of throttle to the substrate are respectively represented by $t_1$, $t_2$ and $t_3$, these $t_1$, $t_2$ and $t_3$ can be defined by the following formula.

$$t_1 = l_1/v_1 \quad (12)$$
$$= [l_1 \times (\pi \times r_1^2)/\{(Q/60) \times (760)\}] \times P_1$$

$$t_2 = l_2/v_2 \quad (13)$$
$$= [l_2 \times (\pi \times r_2^2)/\{(Q/60) \times (760)\}] \times P_2$$

$$t_3 = l_3/v_3 \quad (14)$$
$$= [l_3 \times (\pi \times r_3^2)/\{(Q/60) \times (760)\}] \times P_3$$

With these formula (12), (13) and (14), it is possible to work out the above formula (8).

In actually working out the above formula (8) however, it is also possible to employ the following approximation. Namely, under general conditions ($[O_2] \gg [O]$, $[O_3] < 5 \times 10^{12}$ ($cm^{-3}$) and t<0.5 sec.), the second, third and fifth terms of the right-hand side of the formula (8) are sufficiently small (not more than $\frac{1}{100}$) as compared with the first and fourth terms thereof. Accordingly, the formula (8) can be approximated to the following formula (15).

$$d[O]/dt = -k_2[O][O_2]^2 - k_5[O] \quad (15)$$

Since it can be assumed that $[O_2]$=constant, the formula (15) can be worked out as follows.

$$[O] = [O]_0 \exp\{(-k_2[O_2]^2 - k_5)t\}$$

(when t=0, $[O]=[O]_0$) (16)

It can be seen from the formula (16) that when the pressure is high, or the radius of the pipe is large, a vapor phase reaction becomes predominant ($k_2[O_2] > k_5$). On the other hand, when the diameter of the pipe is small as in the case of a throttle or the temperature is high, a surface reaction becomes predominant ($k_2[O_2] < k_5$).

From the formula (12), (13), (14) and (16), the density of excited oxygen at the inlet of the throttle $[O]_{t1}$, the density of excited oxygen at the outlet of the throttle $[O]_{t2}$, the density of excited oxygen at the vicinity of the substrate $[O]_{t3}$ can be represented respectively by the following formula (17), (18) and (19).

$$([O])_{t1} = ([O])_0 \exp\{(-k_2[O_2]^2 - k_5(1))t_1\} \quad (17)$$

$$([O])_{t2} = ([O])_{t1} \exp\{(-k_2[O_2]^2 - k_5(2))t_2\} \quad (18)$$
$$= ([O])_0 \exp\{(-k_2[O_2]^2 - k_5(1))t_1\} \cdot$$
$$\exp\{(-k_2[O_2]^2 - k_5(2))t_2\}$$

$$[O]_{t3} = ([O])_{t2} \exp\{(-k_2[O_2]^2 - k_5(3))t_3\} \quad (19)$$

wherein $k_5(1)$, $k_5(2)$ and $k_5(3)$ represent respectively a surface reaction rate constant in the dead space, in the nozzle and in the reaction chamber.

The density of excited oxygen at the outlet of the throttle can be represented by the following formula (18).

$$[O]_{t2} = A(P_1/P_M) \cdot \exp\{[-k_2(P_1/P_M)^2 - k_5(1)] \cdot B_1 \cdot P_1\} \cdot \quad (20)$$
$$\exp\{[-k_2(P_1/P_M)^2 - k_5(2)] \cdot B_2 \cdot P_1\}$$
$$= AP_1 \cdot \exp\{f(P_1/P_M)\} \cdot \exp\{gP_1\}$$

wherein $P_M = 2.82 \times 10^{-17}$ [$cm^3 \cdot Torr$].

In the formula (20), A, $B_1$ and $B_2$ respectively, are not function of pressure, and in particular A represents a generation coefficient, and $B_1$ and $B_2$ respectively is defined by the following formula.

$$B_1 = l_1 \cdot (\pi \times r_1^2)/\{(Q/60) \times (760)\} \quad (21)$$

$$B_2 = l_2 \cdot (\pi \times r_2^2)/\{(Q/60) \times (760)\} \quad (22)$$

When the formula (20) is differentiated by $P_1$, the following formula (23) can be obtained.

$$d[O]_{t2}/dP_1 = A \cdot \exp\{f(P_1)\} \cdot \exp\{g(P_1)\} \times \quad (23)$$

$$\{1 - [B_1 \cdot k_5(1) + B_2 \cdot k_5(2)] \cdot$$
$$P_1 - 3(k_2/P_M^2)(B_1 + B_2)P_1^3\}$$

When the pressure $P_{1max}$ meets the condition of $d[O]t_2/dP_1=0$ ($P_1=P_{1max}$), it gives a maximum excited oxygen density, $[O]t_{2max}$ at the outlet of the throttle.

The $P_1$ which meets the condition of the following formula (24) can be represented by the following formula (25).

$$P_1^3 + \frac{P_M^2 \{B_1 k_5(1) + B_2 k_5(2)\}}{3k_2(B_1 + B_2)} P_1 - \frac{P_M^2}{3k_2(B_1 + B_2)} = 0 \quad (24)$$

$$P_{1max} = \sqrt[3]{-y + \sqrt{y^2 + x^3}} + \sqrt[3]{-y - \sqrt{y^2 + x^3}} \quad (25)$$

In the formula (25), x and y is defined by the following formula.

$$x = \frac{P_M^2 \{B_1 K_5(1) + B_2 k_5(2)\}}{9k_2(B_1 + B_2)} \quad [Torr^2]$$

$$y = \frac{-P_M^2}{6k_2(B_1 + B_2)} \quad [Torr^3]$$

The real root of the formula (24) is only one value shown in the formula (25).

In the following paragraphs, the conditions of pressure in the reaction chamber will be discussed.

Since the value of $r_3$ inside the reaction chamber is large, a formula (19) for determining the value of $[O]_{t3}$ can be formulated into the following formula (26).

$$([O])_{t3} \simeq [O]_{t2} \exp(-k_2[O_2]^2 t_3) \quad (26)$$
$$\simeq [O]_{t2} \exp(-k_2(P_3/P_M)^2 t_3)$$

As a value of the pressure $P_3$ inside the reaction chamber, which makes it possible to allow an excited oxygen to reach the vicinity of the substrate with minimum annihilation of the excited oxygen, and to effectively treat the substrate with the excited oxygen, it is possible to employ a value of the pressure $P_3$ inside the reaction chamber, in which the excited oxygen density $[O]_{t3}$ in the vicinity of the substrate becomes higher than $\frac{1}{10}$ of the excited oxygen density $[O]_{t2}$ at the outlet of the throttle. This pressure $P_3$ may be represented by the following formula (27).

$$P_3 \leq 3 \sqrt{\frac{2.303 \times P_M^2}{k_2 \cdot l_3 \cdot (\pi \times r_3^2)/\{(Q/60) \times (760)\}}} \quad (27)$$
$$= P_{3D}$$

As an example, when $P_{1max}$ and $P_{3D}$ were calculated under the conditions of Q=100 ccm, $r_1$=1 cm, $r_2$=7.5×10$^{-2}$ cm, $r_3$=5 cm, $l_1$=2 cm, $L_2$=0.2 cm, $L_3$=4 cm, and T=300° C., the values of 4.4 Torr of $P_{1max}$ and 2.0 Torr of $P_{3D}$ were obtained.

FIG. 3 illustrates the pressure dependency of the generation of oxygen atoms by means of plasma, as well as of the annihilation of oxygen atoms due to the subsequent collision thereof. The graph shown in FIG. 3 is based on the experiments conducted by the present inventors on the pressure dependency of the generation of oxygen atoms. In this graph, the axis of abscissa denotes the pressure, while the axis of ordinate represents the density of oxygen atoms (Ui et al, Spring Meeting of Chem. Eng. Inst., G115 (1993)). In this FIG., a curve a represents experimental values showing the amount of generated excited oxygen in the plasma, a curve b represents calculated values obtained from the above formula showing the amount of excited oxygen $[O]_{t2}$ at the outlet of the throttle, and a curve c represents calculated values obtained from the above formula showing the amount of excited oxygen $[O]_{t3}$ on the surface of the substrate housed in the reaction chamber.

It can be seen from FIG. 3 that the amount of generated oxygen atoms (excited oxygen) in the plasma was increased as the pressure was increased, that the amount of oxygen atoms at the outlet of the throttle was increased as the pressure was increased up to about 4 to 5 Torr, but gradually decreased as the pressure was further increased beyond 4 to 5 Torr, and that the amount of oxygen atoms on the surface of the substrate was increased as the pressure was increased up to about 0.8 Torr, but abruptly decreased as the pressure was further increased beyond 0.8 Torr. The amount of oxygen atoms at the outlet of the throttle indicated a maximum value. However, the point of this maximum value was fluctuated depending on the gas flow rate, the shape and material of feeding pipe and the temperature, as described above.

The results shown in this FIG. 3 can be explained as follows. Namely, the oxygen atoms generated in the plasma were partially annihilated as a result of surface reaction mainly at the inner wall of the feeding pipe such that as the pressure was increased, the amount of oxygen atoms being annihilated was increased. Accordingly, when the pressure exceeds over 4 to 5 Torr, the amount of oxygen atoms was gradually decreased with the increase of the pressure at the feeding pipe. In the reaction chamber on the other hand, a vapor phase reaction between oxygen atoms became more prominent as the pressure was increased, thereby diminishing the amount of oxygen atoms through this vapor phase reaction, and only residual oxygen atoms reach to the substrate. The calculations for determining the curves b and c were conducted from formula (8) under the conditions shown in the above experimental example (temperature of 30° C. at the inner wall of the feeding pipe).

As explained above, although the amount of oxygen atoms can be increased by increasing the pressure, the annihilation of oxygen atoms is also increased due to the collision of them. Therefore, if the generation of oxygen atoms is performed at a high pressure range (for example, 1.0 to 50 Torr, preferably 2 to 20 Torr=$P_1$), and the oxygen atoms thus generated are fed to the reaction chamber ($P_1 > P_3$) reduced in pressure (for example, 0.001 to 2.0 Torr, preferably 0.01 to 1.0 Torr=$P_3$), it is possible to increase the amount of oxygen atoms and at the same time to reduce the amount of annihilation of oxygen atoms, thereby allowing a large quantity of oxygen atoms to be fed to the reaction zone in the reaction chamber. This invention is based on this principle. By the way, the oxygen plasma may become instabilized in its discharge if the pressure exceeds over 50 Torr or so.

Generally, it is possible to define the pressure $P_1$ at the plasma zone in relative to $P_{1max}$ that can be obtained from the formula (25). Namely, if one half density of the maximum excited oxygen density $[O]_{max}$ ($P_1 = P_{1max}$) at the outlet of the throttle can be obtained, a sufficient effect as compared with the conventional technique will be obtained.

Accordingly, if the pressures at the plasma zone for realizing such a density of excited oxygen are represented by $P_4$ and $P_5$, it is possible to feed a high density of excited oxygen to the outlet of the throttle by adjusting the pressure $P_1$ at the plasma zone to meet the following inequality (28).

$$P_4 \leq P_1 \leq P_5 \tag{28}$$

As for the pressure $P_3$ within the reaction chamber, $P_3$ is simply set to a value lower than $P_{3D}$ as shown in the following formula (29).

$$P_3 \leq P_{3D} \tag{29}$$

Therefore, it is possible to feed an excited oxygen of high density to the substrate by adjusting the opening of the throttle so as to meet the above formula (28) and (29) (under the condition of $P_1 > P_3$).

Actually, when the throttle was adjusted, and the conditions of $P_1 = 5$ Torr, and $P_3 = 1$ Torr were set, an excited oxygen density became 10 times higher than that where no throttle was employed (P=1 Torr), and an oxide film-growth rate became 8 times as higher than that where no throttle was employed (P=1 Torr).

In the followings, experiments in relative to various apparatuses for carrying out this invention are explained.

EXAMPLE 1

Figure 4:
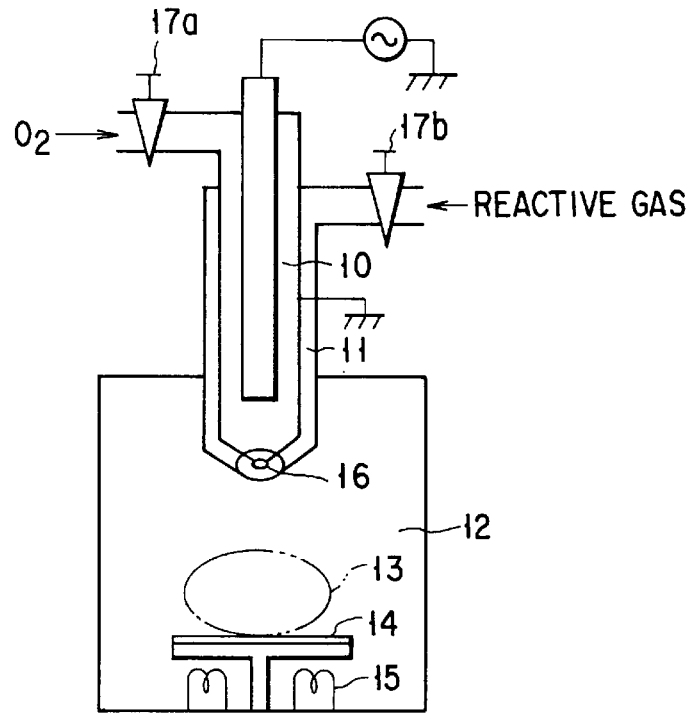
FIG. 4 is a side view of a film-forming apparatus which is furnished with cylindrical electrodes according to a first embodiment of this invention.

FIGS. 4 and 5 show schematic views of apparatus for carrying out the method of this invention. While FIG. 2 as explained above is one having, as excited oxygen-generating element, an inductive coupling type plasma generating apparatus, the apparatus shown in FIG. 4 is provided with cylindrical electrodes, and the apparatus shown in FIG. 5 is provided with a mesh-type electrode. Further, both of them (FIGS. 4 and 5) are featured in having a means to adjust the pressure (for example, a pressure barrier, a throttle and a nozzle).

In the apparatus shown in FIGS. 2 and 4, a passage between the plasma discharge zone (excited oxygen-generating zone) 10 and the reaction chamber 12 is partitioned with a nozzle 16 acting as a pressure barrier. Therefore, a large quantity of oxygen atoms generated at the discharge zone 10 which is kept at a high pressure (for example, about 1.0 to 50 Torr, preferably 2 to 20 Torr) is blown out into the reaction chamber 12 which is kept at relatively low pressure (for example, about 0.001 to 2.0 Torr, preferably 0.01 to 1.0 Torr, $P_1 < P3$). As a result, oxygen atoms which is less diminished in density is fed to the reaction zone 13. The opening of nozzle 16 is conveniently adjusted so as to provide such a pressure difference. The nozzle 16 acting as a pressure barrier is preferably formed of glass, ceramics, Teflon, aluminum or alumina in order to prevent the excited oxygen from annihilated due to the collision thereof to the wall of nozzle 16 (Hatanaka et al, Shinku, Vol.35,35, NO11, 1992, Nihon Shinku Association).

Figure 5A:
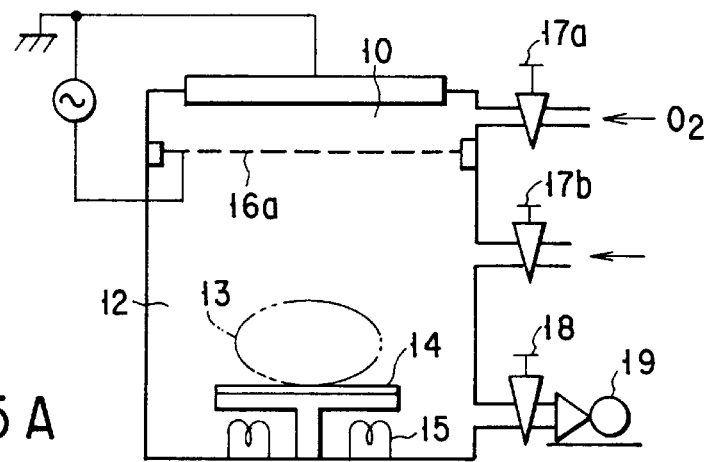
FIG. 5A is a side view of a film-forming apparatus which is furnished with a mesh electrode as a pressure barrier wall according to a first embodiment of this invention.
Figure 5B:
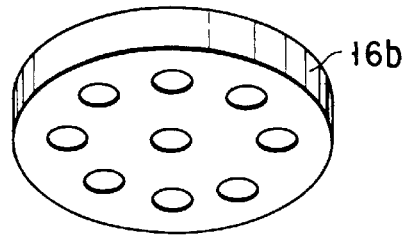
FIG. 5B is a perspective view of a porous electrode as a pressure barrier.

In the apparatus shown in FIG. 5A, a small mesh electrode 16a is mounted as a pressure barrier at the pore portion in place of the nozzle. It is also possible to employ a porous electrode 16b provided with a plurality of small holes as shown in FIG. 5B in place of the small mesh electrode 16a. In order to minimize the annihilation of excited oxygen due to collision thereof, it is desirable to employ aluminum, platinum or gold as the material for the mesh or porous electrode metal. The porosity of these electrodes may be conveniently selected so as to provide a sufficient pressure difference.

EXAMPLE 2

In the embodiments shown in FIGS. 2, 4 and 5, the reaction chamber 12 is partitioned from the plasma discharge zone 10 by means of a pressure barrier (nozzle 16). However, such a pressure barrier may be omitted. Namely instead of mounting the pressure barrier (nozzle 16), a pressure wave-generating device which is capable of generating a suitable pressure wave may be mounted. This pressure wave-generating device can be operated in synchronous with the ON and OFF of the plasma discharge, so that the discharge of plasma is effected when the pressure is raised thereby generating a large quantity of oxygen atoms, and the transferring of the oxygen atoms is effected by lowering the pressure.

Examples of the pressure wave-generating device may be a manipulating device to open or close valves 17a and 17b mounted respectively on the gas-feeding ports, or valve 19 mounted on an exhauster 19 disposed downstream of the apparatus as shown in FIGS. 4 and 5.

It is also possible to generate a pressure wave by abruptly heating air with a lamp so as to expand the air.

A pressure wave-generating device 21 may be disposed as shown in FIG. 6 so as to feed a pressure wave 22 to a discharge zone 24 which is operated by means of an electric signal 23.

FIG. 7 indicates changes with time of the pressure (a) and plasma (b, c and d) as a pressure wave is fed to the discharge zone 24 by the pressure wave-generating device 21 as shown in FIG. 6. AS shown in FIG. 7, the plasma discharge is effected when the pressure is raised thereby generating a large amount of oxygen atoms, and the plasma discharge is turned off as the pressure is lowered thereby minimizing the amount of annihilation of excited oxygen and feeding excited oxygen to the reaction zone (b). The electric signal for the plasma discharge may be an ON-OFF signal, or an amplitude modulation. The fluctuations of the pressure and plasma may be periodic or aperiodic as long as they are synchronous with each other. It is also possible to fluctuate only the pressure, while constantly discharging the plasma (DC plasma: see (c) in FIG. 7), or to cause the plasma discharge to fluctuate at a higher frequency as compared with the fluctuation cycle of the pressure (see (d) in FIG. 7). In either cases, the oxygen atoms are fed to the reaction zone in large quantity as the pressure is lowered.

EXAMPLE 3

In the embodiments shown above, the reduction of annihilation of excited oxygen is effected by lowering the pressure in the reaction chamber to less than that in the plasma discharge zone. However, it is impossible to suppress the annihilation amount to zero, i.e. a portion of the excited oxygen is always annihilated. However, it has been found that it is possible to further diminish the annihilation amount of excited oxygen, and at the same time to increase the generation amount of excited oxygen in the reaction chamber by disposing an additional exciting device 10a also in the reaction chamber as shown in FIG. 8. This additional exciting device to be disposed in the reaction chamber may be the exciting device 10a utilizing plasma as shown in FIG. 8, or a light-irradiation device 20 as shown in FIG. 9.

FIGS. 8 and 9 illustrates embodiments wherein a mesh electrode is employed as an exciting device. The shape of the exciting device may be a double cylindrical type or an inductive coupling type. The position of the reactive gas-feeding port may be optionally selected depending on the end use of excited oxygen. For example, the reactive gas-feeding port may be disposed at upstream or downstream of the exciting device 10a or the light-irradiation device 20, or inside the exciting device 10a or the light-irradiation device 20.

When oxygen atom is taken as an example of excited oxygen, part of annihilated oxygen atoms is turned into ozone, which is then decomposed upon irradiation of ultraviolet light (200 to 300 nm) thereby producing again oxygen atoms as shown in the following formula (30).

$$O_3 + h\nu \rightarrow O + O_2 \tag{30}$$

These procedures are also applicable to an apparatus where any pressure barrier is not provided with as shown in the Example 2.

EXAMPLE 4

FIG. 10 shows a graph indicating changes in density of oxygen atoms when a rare gas is added to an oxygen plasma. As shown in FIG. 10, when a rare gas is added to an oxygen plasma at a predetermined ratio, the density of oxygen atoms is increased as compared with a plasma consisting solely of oxygen.

When a rare gas X such as argon, helium or neon is added to an oxygen plasma, part of X is turned into a metastable excited state $X^m$ as the X is impinged by electrons in the plasma as indicated in the formula (31) shown below. This $X^m$ acts upon oxygen or oxygen atoms to ionize through the Penning ionization as indicated in the formula (31) and (32) shown below, thereby increasing the density of electrons in the plasma. In this manner, the density of electrons in the plasma can be increased by the addition of a rare gas, and at the same time the excitation and decomposition of oxygen are also increased thus increasing the density of oxygen atoms.

Further, $X^m$ is also capable of directly exciting and decomposing oxygen gas as shown in the following formula (34). Namely, oxygen gas is not only excited and decomposed through the collision with electrons (Formula 1), but also excited and decomposed through the reaction shown in the formula (34), thereby giving oxygen atoms.

$$X + e \rightarrow X^m + e \tag{31}$$

$$O_2 + X^m \rightarrow O_2^+ + X + e \tag{32}$$

$$O + X^m \rightarrow O^+ + X + e \tag{33}$$

$$O_2 + X^m \rightarrow O + O + X \tag{34}$$

Owing to these two effects, the density of $X^m$ as well as the density of oxygen atoms are increased, as the amount of a rare gas X being added is increased as shown in FIG. 10. In particular, when a rare gas to be added is argon (X=Ar), the decomposition reaction of oxygen by a metastable excited $Ar^m$ is more prone to occur.

FIG. 11 shows a graph (the results of experiments), which indicates the pressure dependency of the amount of oxygen atoms to be generated, as argon is added to oxygen gas in an amount of 7 times (by volume) as much as that of oxygen gas. In this FIG., a white circle indicates an example where 100% of oxygen gas was employed, and a black circle indicates an example where Ar is added to oxygen gas with the total flow rate being kept the same as that of the example indicated by the white circle. As seen from this graph, when the pressure is increased, the density of Ar is also increased, thereby resulting in an increase of $Ar^m$ density, thus increasing the generation of oxygen atoms. This effect of increasing the generation of oxygen atoms becomes more prominent in case where Ar is added compared with a case where only oxygen gas is employed. In this manner, it is possible to feed a large quantity of oxygen atoms to the reaction zone by employing the methods and apparatus illustrated in the above Examples 1 to 3. In this case, the effect of increasing the generation of oxygen atoms becomes more prominent as compared with a case where the plasma is consisted of only oxygen gas. In particular, when the mixing ratio of Ar gas is in the range of 30 to 90%, this effect is most prominent.

These effects are not confined to argon, but the same effects can be obtained with the use of other rare gases such neon, helium and krypton gas. Preferred mixing ratio for obtaining a prominent effect is 10 to 60% in the case of neon gas, and 5 to 50% in the case of helium gas.

EXAMPLE 5

In this example, a method of increasing the electron density in a plasma for increasing the generation of oxygen atoms will be discussed.

Figure 12:
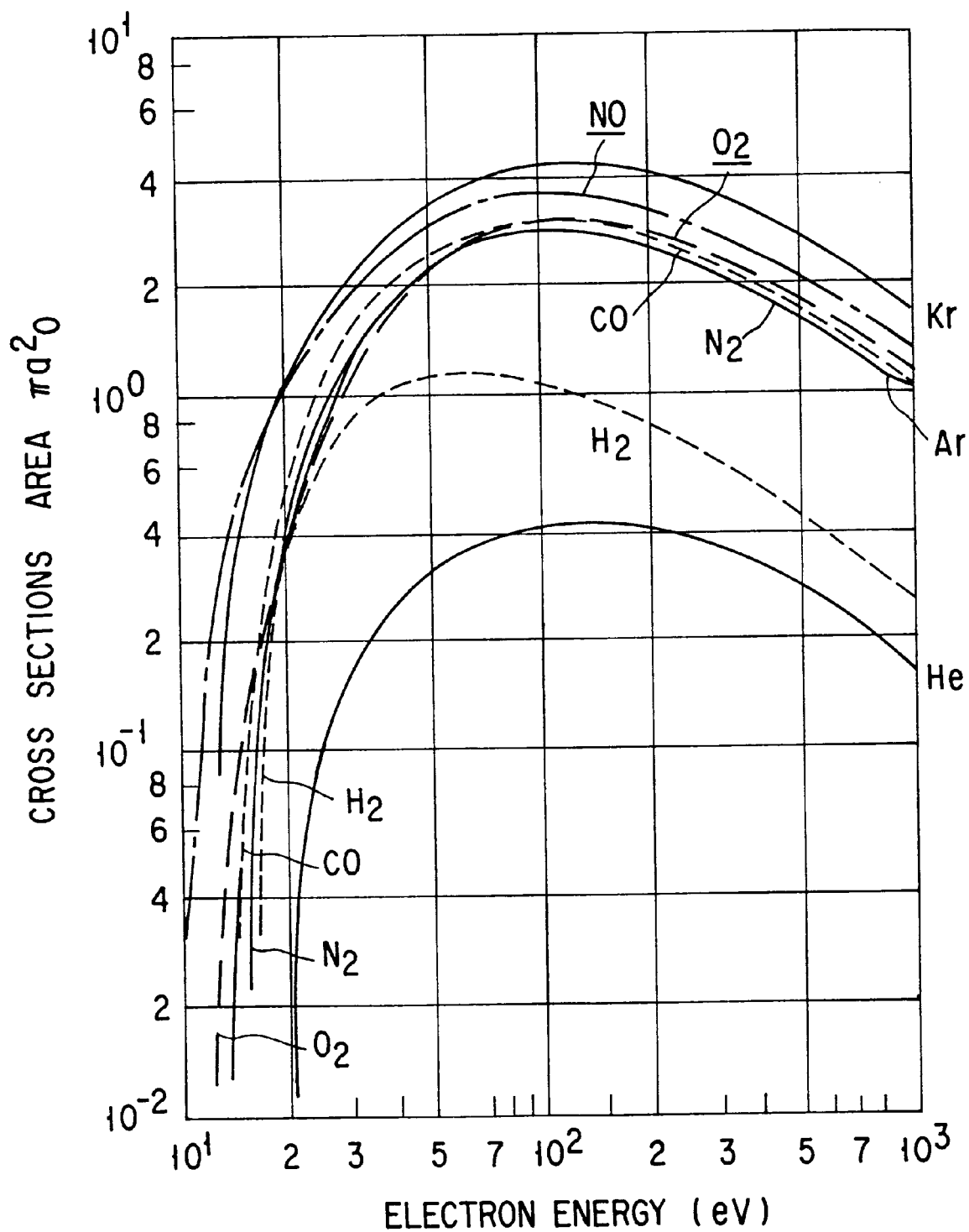
FIG. 12 is a graph showing ionization cross sections of molecules.

When a raw gas is mixed with a gas Z (Z is at least one kinds of gases selected from nitrogen monoxide gas, carbon monoxide gas, krypton gas and xenon gas), a portion of the gas Z is turned into $Z^+$ ions according to the following formula (35), thus generating electrons thereby increasing the density of electrons, because these gases are large in ionizing cross sections (see FIG. 12). Therefore, when these gases are mixed into an oxygen gas, the generation of oxygen atoms can be increased.

$$Z+e \rightarrow Z^+ +e+e \quad (35)$$

Further, when the vapor of an element selected from Group I or Group II (Y) in the periodic table is introduced into the plasma, the element is turned into an ion thus increasing the density of electron (formula (36)), because the metallic vapors of these elements are more likely to be ionized ($Y^+$, $Y^{2+}$).

$$Y+e \rightarrow Y^+ +e+e \quad (36)$$

FIG. 13 illustrates one example of apparatus for carrying out this method. In this apparatus, a metal 30 is introduced into a crucible 31, and heated therein to be vaporized (or sublimated) thereby forming a metallic vapor, which is then fed into the plasma. Since the boiling (sublimation) points of elements of Group I or Group II (Y) are high, it may be required to heat them to a high temperature. However, if a compound of Y, for example an organic compound thereof (RY) is employed, it can be easily vaporized at a low temperature, so that it is possible to feed it into the plasma by slightly heating the compound. The compound RY is decomposed in the plasma into R and Y, and this Y is then ionized ($Y^+$, $Y^{2+}$).

The group I elements include, for example, lithium, sodium, potassium, and caesium. The group II elements include beryllium, magnesium, calcium, strontium, and barium.

The organic compound of the group I or group II element includes $C_2H_5Na$, $RC_2Na$, $RC_2Li$ and $RC_2K$ (R is alkyl group).

EXAMPLE 6

When a material containing 0.01% or more of an element from Group I or Group II is coated on the surface of electrode in the discharge zone, or when a material contain-ing an element from Group I or Group II is disposed over the surface of electrode, a portion of the material is beaten out as it is impinged with ions or electrons existing in the plasma during the discharging period, and turned into an ion ($Y^+$) thereby increasing the density of electrons.

The coating or arrangement of a material containing an element from Group I or Group II is not necessarily confined to the surface of electrode plate, but may be anywhere in the vicinity of an electrode to be exposed to the plasma. For example, in the case of RF plasma of inductive coupling type (electrodeless plasma), a material containing an element from Group I or Group II may be coated on the inner surface of a quartz tube in the plasma discharge zone, or disposed near the inner surface of a quartz tube.

The elements shown in Example 5 can be used as group I or group II elements. The substance containing the group I element may be, for example, NaCl, NaOH, KCl, or organic metal compound. The substance containing the group II element may be, for example, $Ca(OH)_2$, $CaCl_2$, and organic metal compound.

EXAMPLE 7

In this example, a method of generating the oxygen atoms through the decomposition of ozone, and feeding the oxygen atoms will be discussed. FIG. 14 illustrates a schematic view of an apparatus for carrying out this method. This apparatus comprises an ozone-generating device 40 for generating ozone from several hundreds Torr to about the normal pressure. An ozone-feeding zone 41 is partitioned through a pressure barrier wall (for example a nozzle) 43 from a reaction chamber 42, the interior of which is kept to a lower pressure (for example 0.01 to 5 Torr) as compared with that in the ozone-feeding zone 41. The ozone to be fed into the low pressure reaction chamber 42 through the nozzle 43 is readily decomposed by ultraviolet ray 45 (for example an ultraviolet ray having a wavelength of 254 nm, which can be derived from a mercury lamp) according to the following formula (37) thereby generating oxygen atoms to be offered for the reaction in the reaction zone 47.

$$O_3+h\nu \rightarrow O+O_2 \quad (37)$$

Ozone can be decomposed up to 84% thereof by exposing it under the conditions of 1 w or more of ultraviolet ray 254 nm in wavelength, a pressure of 1 Torr in the reaction chamber, and a ray width (the flow direction of ozone) of 10 cm. It is possible to generate ozone at the density of about 10% by using a performance ozone generator, and the resultant ozone is then decomposed by the irradiation of the ultraviolet ray, thus generating almost the same amount (about 8%) of oxygen atoms. The amount of oxygen atoms thus generated is far larger as compared with that to be generated when oxygen gas is subjected to plasma decomposition as it is (the decomposition ratio of oxygen gas is 0.1 to 2%).

The location of the light-irradiation device (light source) 44 may be upstream of the reactive gas-feeding port 46, or vice versa. It is also possible to dispose the reactive gas-feeding port 46 in the light-irradiation device.

The decomposition of ozone at the low pressure reaction zone may be conducted by means of plasma as shown in FIGS. 15 to 17. In this case, the apparatus may comprises, as shown in FIGS. 15 to 17, an ozone-feeding zone communicated with the ozone-generating device 55, a nozzle 59, a discharge zone 50 and a reaction chamber 52.

Ozone is generated at a pressure of for example several hundreds Torr to about the normal pressure, and then fed through a nozzle 59 to a discharge zone 50 kept at a low pressure (for example about 0.01 to 5 Torr). Oxygen atoms decomposed from ozone by a plasma is fed to a reaction zone 53 of the reaction chamber. Ozone is more easily decomposed in energetic view point as compared with oxygen gas, so that ozone can be easily decomposed by plasma (formula (38) shown below).

$$O_3+e \rightarrow O+O_2+e \qquad (38)$$

Figure 19:
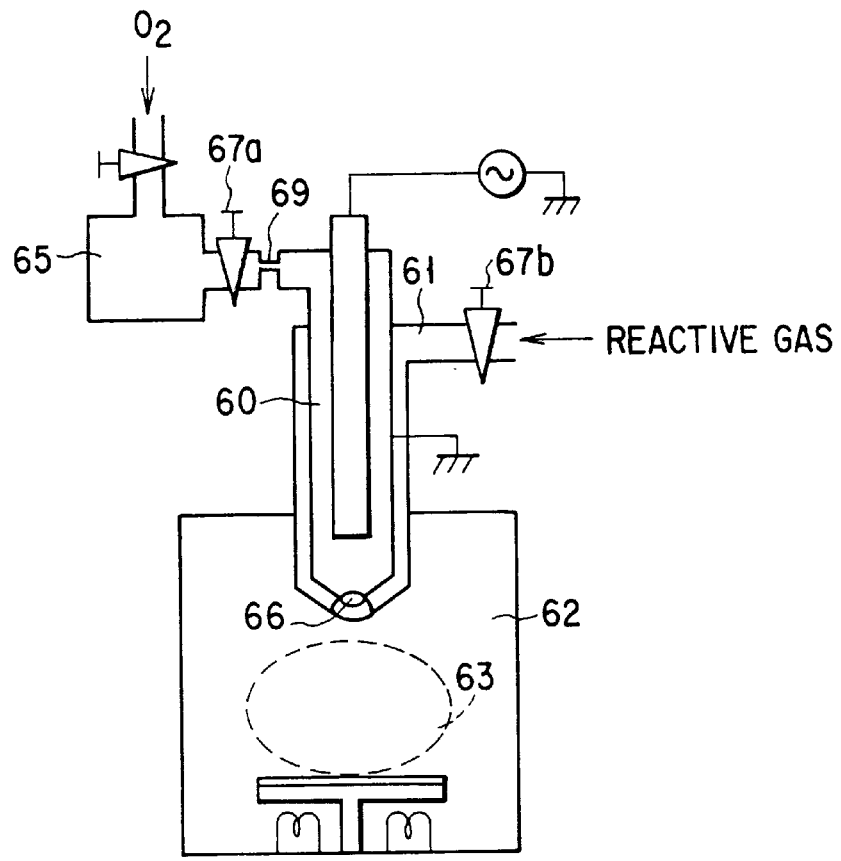
Figure 20:
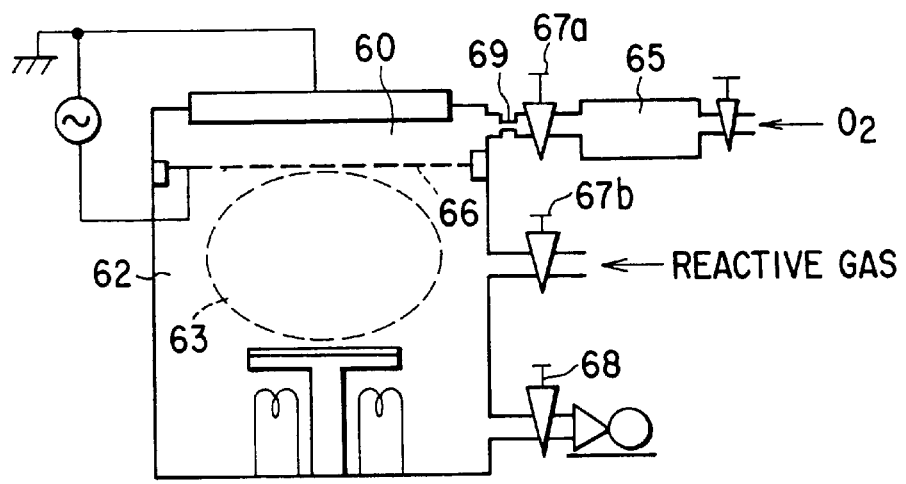

A couple of nozzles 66 and 69 may be employed for partitioning the apparatus into three zones different in pressure from one another as shown in FIGS. 18 to 20 (in FIG. 20, the nozzle 66 corresponds to the fine mesh or porous electrode as illustrated in Example 1). Namely, this apparatus comprises an ozone-feeding zone (for example from several hundreds Torr to about the normal pressure) communicating with an ozone-generating device 65, an ozone-decomposition/oxygen atom-generating zone 60 (for example, about 1.0 to 5 Torr) and an oxygen atom-feeding/reaction zone 63 (for example, about 0.01 to 1.0 Torr). According to this apparatus, it is possible to lower the amount of annihilating oxygen atoms, and to increase the amount of oxygen atoms to be fed to the reaction zone 63.

Although not so active as that of oxygen atom, ozone itself is also chemically active so that ozone is capable of causing a reaction. Since ozone can be fed at a higher pressure as compared with feeding oxygen atom, an intermediate product can be caused to condense at the time of film-forming by selecting a suitable conditions, so that it is possible to bury a narrow groove or step portion with an oxide film in a fluid-like manner (for example, an oxide film formed with TEOS and ozone). In other words, a narrow groove or step portion can be flatly buried.

However, since the oxide film thus obtained is accompanied with a lot of water therein, and poor in insulation, it is required to modify the feature of the film by subjecting it to react with oxygen atoms. In this case, this modification can be effectively carried out during the film-forming step, or repeating the steps of film-forming and the subsequent modification. As explained above, some times, it is preferable to cause the reaction by employing ozone rather than employing excited oxygen such as oxygen atom.

In order to interchangeably feed ozone or oxygen atom, an apparatus shown in FIG. 21 can be employed. This apparatus comprises an ozone-feeding device 75 and an excited oxygen-feeding device 70 (for example, apparatus for carrying out the methods shown in Examples 1 to 6) which is disposed independent from the ozone-feeding device 75.

According to this apparatus, it is possible to interchangeably feed ozone or oxygen atom by switching the valves 77a and 77b. Further, if both valves 77a and 77b are opened at the same time, both of ozone and oxygen atom can be fed to the reaction chamber 72. In this case, the feeding ratio of ozone and oxygen atom can be varied, if the opening degree of any of these valves is suitably adjusted.

With the apparatus shown in FIGS. 18 to 20, it is possible to interchangeably feed ozone or oxygen atom by switching ON-OFF of the exciting device 60, which controls the decomposition of ozone. Further, it is also possible to carry out ON-OFF manipulation of the exciting device 60 by linking ON of the exciting device 60 with OFF of the ozone-generating device 65.

It is also possible to simultaneously feed ozone and oxygen atom by weakening the excitation capacity of the exciting device 60. In this case, it is possible to adjust the feeding ratio of ozone and oxygen atom by adjusting the output of the exciting device, adjusting the intensity of light, adjusting the wavelength, adjusting the power of discharge, or changing the pressure conditions.

EXAMPLE 8

FIG. 22 shows a graph indicating the dependency of metastable excited state Xm density on the added rate of argon as a rare gas (argon) is added to the oxygen plasma. As shown in FIG. 22, RXmS density is increased as the added rate of argon is increased. As shown in this FIG. the RXmS density becomes maximum when Ar is 100%.

Figure 23:
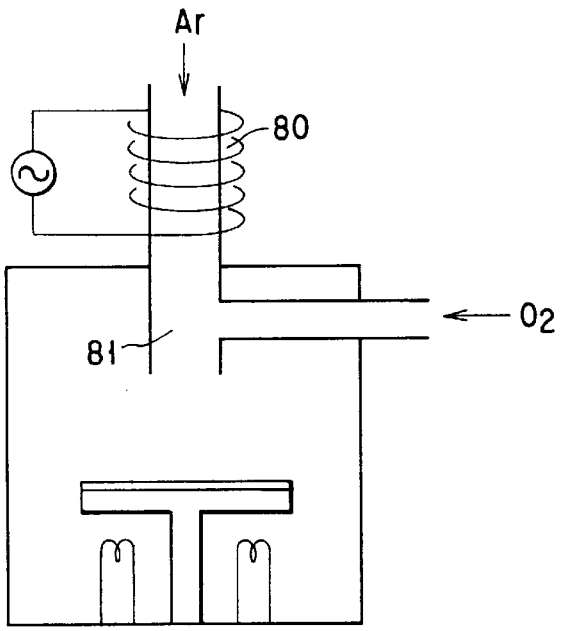
Figure 24:
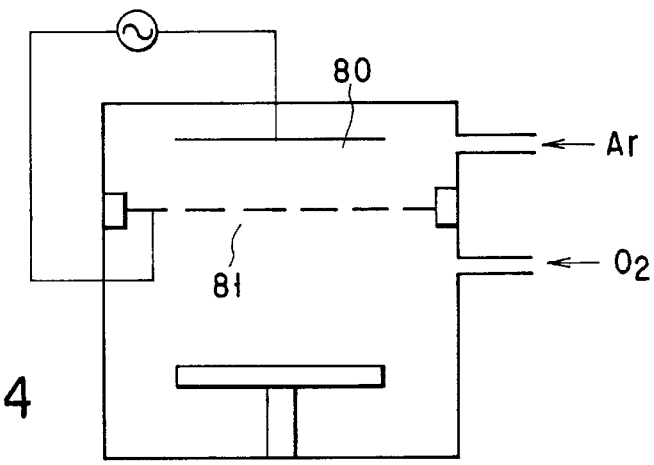

This metastable excited state RXmS is capable of decomposing oxygen gas according to the aforementioned formula (34) thereby generating oxygen atoms. This reaction is fast (the collision sectional area is not more than $10^{-15}$ cm$^2$), and can be easily developed. Accordingly, it is possible to generate oxygen atoms by introducing Ar into the discharge zone 80, thereby causing the metastable excited state RXmS to be formed, and by introducing an oxygen gas into the downstream 81 of the discharge zone as shown in FIGS. 23 and 24. In this case, when an additional exciting device is mounted on the oxygen gas-feeding tube for exciting a portion of the feeding oxygen gas, the oxygen gas can be decomposed more easily, which benefits to the generation of a large amount oxygen atoms.

Figure 25:
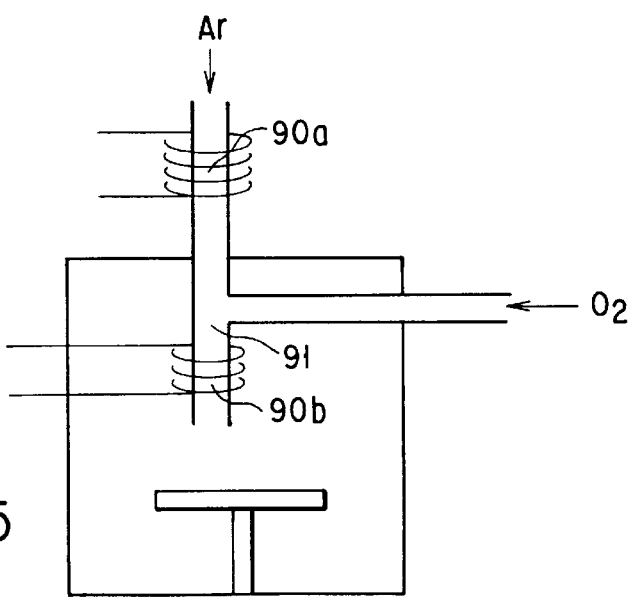

Further, when an exciting device 90b is mounted at a reaction zone 91 of a mixed gas consisting of Ar$^m$ generated at an exciting device 90a and oxygen gas as shown in FIG. 25, the excitation and decomposition of oxygen gas may be further promoted. In this case, this exciting device may be a plasma-generating device as shown in FIG. 25, or a light-irradiating device (not shown).

The generation of Ar$^m$ in the reaction shown in the aforementioned formula (31) is more ready to proceed as the pressure becomes higher. Accordingly, the generation of oxygen atoms may be carried out by disposing a pressure barrier wall (nozzle) 96 at the outlet of the exciting discharge zone 90 as shown in FIG. 26, and effecting the discharge at a high pressure (for example, about 5 to 760 Torr) thereby forming Ar$^m$, which is then mixed with oxygen gas at a mixing zone kept at a low pressure (for example, about 0.1 to 5 Torr). In this case, it is possible to provide a pressure difference according to the method illustrated in Example 2.

For the purpose of increasing the times of collision of Ar$^m$ with oxygen gas thereby making the reaction to occur more easily, a pressure barrier (for example, a nozzle) 96 may be mounted downstream of a mixing/reaction zone 99 as shown in FIG. 27, and effecting the generation of a large amount of oxygen atoms at a high pressure (for example, about 3 to 100 Torr) thereby forming Ar$^m$, and feeding the oxygen atoms to a reaction chamber 92 kept at a low pressure (for example, about 0.01 to 3 Torr).

The mixing/reaction zone of Ar$^m$ and oxygen gas may be heated so as to promote the reaction.

Although Example 8 is explained with reference to Ar, other rare gases for example neon, helium, krypton, and xenon gas may also be employed in place of argon.

EXAMPLE 9

The present inventors have examined the dependency of the survival rate of excited oxygen on a temperature in the occasion of annihilation due to the surface reaction of excited oxygen generated in the plasma with the inner wall of the excited oxygen-feeding pipe. Specifically, the survival rate of excited oxygen at the outlet of the pipe was calculated under the conditions wherein the excited oxygen was flown through an aluminum pipe 12 mm in inner diameter and 20 mm in length at a pressure of 4 Torr and at the flow rate of 100 sccm. The results are shown in FIG. 28.

It can be seen from FIG. 28 that the lower the temperature is, i.e. the lower the temperature of the excited oxygen-feeding pipe is, the smaller the amount of excited oxygen which has been annihilated.

FIG. 29 shows one embodiment wherein a cooling jacket 123 is mounted around the periphery of a nozzle 122 of the excited oxygen-feeding pipe 121. A fluid to be flown through this jacket 123 may be air, water, liquid nitrogen, liquid helium or any other cooling medium. This cooling system is not confined to this cooling jacket, but any other kinds of cooling system, for example an electron cooling system such as those employing Peltier element may also be employed.

FIG. 30A shows one embodiment wherein a porous plate electrode 131a having a cooling mechanism is employed. On the other hand. FIG. 30B shows other embodiment wherein a porous plate electrode 131b is formed of a metallic electrode having through holes which are buried respectively with a quartz fine tube 132. In this embodiment, a cooling water is caused to flow around the through hole. FIG. 30C shows other embodiment wherein a porous plate electrode 131c is formed of an insulating body (for example, quartz, ceramic or plastic) having through holes and a metallic vapor deposition on the upper surface thereof. In this embodiment, a cooling water is caused to flow through the interior of the electrode.

EXAMPLE 10

In this embodiment, an apparatus provided with a throttle capable of changing its opening was employed. Namely, as shown in FIGS. 31A and 31B, this apparatus comprises a porous electrode plate 141 having through holes and a partitioning plate 142 disposed below the electrode plate 141 and consisting of a porous plate having through holes which correspond to the through holes of the electrode plate 141. In this case, the opening degree of the through holes of the electrode plate 141 can be reduced by horizontally shifting the partitioning plate 142 by means of a moving mechanism 143 and disagreeing the through holes facing to each other.

The moving mechanism 143 is linked to a pressure sensor 144 adopted to detect the pressure of the plasma zone, and can be actuated by the signals from the pressure sensor 144. Namely, it is possible to set a pressure of the pressure sensor 144 which causes the density of the excited oxygen to become maximum. With this mechanism, it is possible to feed a prescribed amount of excited oxygen regardless of the changes in the gas flow rate and the kinds of feeding gas.

Further, it is possible to generate ozone by setting the pressure of plasma zone from 50 to several hundreds Torr. Accordingly, it is possible to alternately carry out the process requiring ozone as well as the process requiring excited oxygen with one apparatus by shifting the partitioning plate 142 thus changing the pressure within the plasma zone.

For example, at the initial stage, the pressure is set to high and a fluid oxide film is formed by employing TEOS and ozone, thereby burying the grooves between the multi-layered wirings, and subsequently the pressure is lowered and an oxide film of high quality is grown by using TEOS and excited oxygen.

It is also possible as shown in FIG. 32 to link the moving mechanism 143 with a density sensor 145 of excited oxygen, which is installed within the reaction chamber. Namely, when the density of excited oxygen in the vicinity of the substrate is found to be low, the moving mechanism 143 is actuated so as to narrow the opening of the porous plate electrode 141, thereby increasing the pressure of the plasma zone and increasing the generation of excited oxygen.

It is also possible as shown in FIG. 33 to link the moving mechanism 143 with a laser density measuring apparatus 146.

In the above embodiments, the pressure barrier wall (throttle) is disposed downstream of plasma zone. However, the arrangement of the pressure barrier wall is not restricted to the above embodiments, but a throttle 151 may be mounted at the plasma zone. In this arrangement, the annihilation of excited oxygen can be minimized and a large amount of excited oxygen can be fed to the reaction chamber, since the oxygen can be excited by the plasma even at the downstream of the throttle 151.

In the invention described in Examples 1 to 6 as well as Examples 8 to 10, it is possible to employ not only oxygen gas, but also any kinds of oxygen-containing gas for example $NO_2$, $N_2O$, $N_2O_4$, NO, $CO_2$, CO, $SO_2$, $O_3$.

It may or may not be required, depending on the construction and end use of the apparatus, to mount a feeding pipe for gases other than oxygen or a gas containing oxygen.

The excited oxygen to be generated is not limited to oxygen atom, but oxygen atom or molecule in an excited state can also be generated at the same time, and since they are also chemically active, they can be utilized for forming film or etching. Since these oxygen atom and molecule are subject to annihilate as a result of collision thereof as in the case of oxygen atom, it is also advisable to lower only the reaction chamber at the occasion of feeding them.

This invention has been explained with reference to excited oxygen. However, this invention is not limited to the excited oxygen, but is also applicable to hydrogen radical and nitrogen radical in the same manner as in the case of the excited oxygen. However, an optimal pressure range differs from that of the excited oxygen As explained above, it is possible according to this invention to generate a large quantity of excited oxygen such as oxygen atom, and to feed the excited oxygen to a reaction zone.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of supplying an excited oxygen, which comprises the steps of:

exciting a gas containing an oxygen gas or oxygen atoms with plasma in a first atmosphere thereby forming an excited oxygen; and transferring a gas containing the excited oxygen into a second atmosphere disposed next to the first atmosphere while keeping a pressure within the second atmosphere lower than that of the first atmosphere;

wherein said pressure within the second atmosphere is kept lower than that of the first atmosphere by disposing a pressure barrier between the second atmosphere and the first atmosphere, and wherein said pressure barrier is a mesh electrode for generating a plasma.

2. A method of supplying an excited oxygen, which comprises the steps of:

exciting a gas containing an oxygen gas or oxygen atoms with plasma in a first atmosphere thereby forming an excited oxygen; and transferring a gas containing the excited oxygen into a second atmosphere disposed next to the first atmosphere while keeping a pressure within the second atmosphere lower than that of the first atmosphere;

wherein said pressure within the second atmosphere is kept lower than that of the first atmosphere by disposing a pressure barrier between the second atmosphere and the first atmosphere, and wherein said pressure barrier is a porous plate electrode for generating a plasma.

3. A method of supplying an excited oxygen, which comprises the steps of:

exciting a gas containing an oxygen gas or oxygen atoms with plasma in a first atmosphere thereby forming an excited oxygen; and transferring a gas containing the excited oxygen into a second atmosphere disposed next to the first atmnosphere while keeping a pressure within the second atmosphere lower than that of the first atmosphere;

wherein said pressure within the second atmosphere is kept lower than that of the first atmosphere by disposing a pressure barrier between the second atmosphere and the first atmosphere, and wherein a pressure $P_1$ in said first atmosphere is one which meets a condition of $P_4<P_1<P_5$, wherein $P_4$ and $P_5$ are pressures which allow one half of a maximum density [O] of excited oxygen being fed from said first atmosphere to said second atmosphere and calculated according to the following differential equation (1) to be obtained; and a pressure $P_2$ in said second atmosphere is one which meets not only the following formula (7) but also a condition of $P_4>P_3$:

$$d[O]/dt = -k_2[O][O_2]^2 - k_3[O]^2[O_2] - k_4[O]^3 - k_5[O] - k_6[O][O_3] \quad (1)$$

wherein $k_2$, $k_3$, $k_4$, $k_5$ and $k_6$ are respectively a reaction rate constant which respectively meets the following chemical reaction formula (2) to (6); and [O], [$O_2$] and [$O_3$] are respectively density of oxygen, oxygen gas and ozone:

$$O+O_2+O_2[M] \rightarrow O_3+O_2(M) \quad (2)$$

(wherein M denotes a third body in a collision of three bodies)

$$O+O+O_2(M) \rightarrow O_2+O_2(M) \quad (3)$$

$$O+O+O(M) \rightarrow O_2+O(M) \quad (4)$$

(wherein M denotes a third body as defined above)

$$O+\text{the inner wall} \rightarrow 1/2 O_2 \quad (5)$$

$$O+O_3 \rightarrow 2O_2 \quad (6)$$

$$P_3 \leq \sqrt{\frac{2.303 \times P_M^2}{k_2 \cdot l_3 \cdot (\Pi \times r_3^2)/\{(Q/60) \times 760\}}} = P_{3D} \quad (7)$$

wherein $P_M = 2.82 \times 10^{-17}$ [cm$^3$·Torr]; $l_3$ is a dimension of gas flow length in the second atmosphere; $r_3$ is a dimension of glass flow measured in perpendicular to the direction of the flow in the second atmosphere; and Q is a flow rate of a gas containing excited oxygen.

4. The method according to claims 3, wherein said pressure $P_1$ is one which meets a condition of $P_4<P_1<P_5$, wherein $P_4$ and $P_5$ are pressures which allow one half of a maximum density [O] of excited oxygen being fed from said first atmosphere to said second atmosphere to be obtained under a condition of $P_{1max}$ represented by the formula shown below;

$$P_{1\max} = 3\sqrt{-y + \sqrt{y^2 + x^3}} + 3\sqrt{-y - \sqrt{y^2 + x^3}} \quad (8)$$

In the formula (25), x and y is defined by the following formula, $$x = \frac{P_M^2 \{B_1 K_5(1) + B_2 k_5(2)\}}{9k_2(B_1 + B_2)}$$

$$y = \frac{-P_M^2}{6k_2(B_1 + B_2)}$$

wherein $B_1$ and $B_2$ respectively is defined by the following formula, $$B_1 = l_1 \cdot (\pi \times r_1^2)/\{(Q/60) \times (760)\} \quad (9)$$

$$B_2 = l_2 \cdot (\pi \times r_2^2)/\{(Q/60) \times (760)\} \quad (10)$$

wherein $l_1$ is a dimension of gas flow length in the second atmosphere; $r^1$ is a dimension of gas flow measured in perpendicular to the direction of the flow in the first atmosphere; $l_2$ is a dimension of gas flow length at the pressure barrier wall; and $r_2$ is a dimension of gas flow measured in perpendicular to the direction of the flow at the pressure barrier wall.

5. A method of supplying an excited oxygen, which comprises the steps of:

exciting a gas containing an oxygen gas or oxygen atoms with plasma in a first atmosphere thereby forming an excited oxygen;

transferring a gas containing the excited oxygen into a second atmosphere disposed next to the first atmosphere while keeping a pressure within the second atmosphere lower than that of the first atmosphere;

wherein said pressure within the second atmosphere is kept lower than that of the first atmosphere by disposing a pressure barrier between the second atmosphere and the first atmosphere; and cooling the pressure barrier.

6. A method of supplying an excited oxygen, which comprises the steps of:

exciting a gas with plasma in a first atmosphere thereby forming an excited gas; and transferring the excited gas into a second atmosphere containing one of an oxygen gas and a gas containing oxygen atoms disposed next to the first atmosphere while keeping a pressure within the second atmosphere lower than that of the first atmosphere, thereby forming the excited oxygen;

wherein said pressure within the second atmosphere is kept lower than that of the first atmosphere by disposing a pressure barrier between the second atmosphere and the first atmosphere, and wherein said pressure barrier is a mesh electrode for generating a plasma.

7. A method of supplying an excited oxygen, which comprises the steps of:

exciting a gas with plasma in a first atmosphere thereby forming an excited gas; and transferring the excited gas into a second atmosphere containing one of an oxygen gas and a gas containing oxygen atoms disposed next to the first atmosphere while keeping a pressure within the second atmosphere lower than that of the first atmosphere, thereby forming the excited oxygen;

wherein said pressure within the second atmosphere is kept lower than that of the first atmosphere by disposing a pressure barrier between the second atmosphere and the first atmosphere, and wherein said pressure barrier is a porous plate electrode for generating a plasma.

8. The method according to claims 2 or 3, wherein said porous plate electrode is variable in pore diameter thereof.

9. The method according to claim 8, wherein said pore diameter is variable in accordance with the pressure in said first atmosphere or the density of excited oxygen in said second atmosphere.

10. The method according to any one of the claims 1,3, 5–7, wherein a material containing one element selected from the group consisting of Group I elements and Group II elements is disposed in said plasma or at the vicinity of said plasma.

11. The method according claims 6–7, wherein said gas is at least one gas selectee from the group consisting of hydrogen gas, a gas containing hydrogen gas, nitrogen gas and a gas containing nitrogen gas, and said excited gas is at least one gas selected from the group consisting of excited hydrogen and excited nitrogen.

* * * * *